(12) United States Patent
Yen et al.

(10) Patent No.: US 11,830,799 B2
(45) Date of Patent: Nov. 28, 2023

(54) SEMICONDUCTOR DEVICE PACKAGE, ANTENNA DEVICE, AND METHOD FOR MANUFACTURING THE SAME

(71) Applicant: Advanced Semiconductor Engineering, Inc., Kaohsiung (TW)

(72) Inventors: You-Lung Yen, Taoyuan (TW); Bernd Karl Appelt, Holly Springs, NC (US)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 136 days.

(21) Appl. No.: 17/223,932

(22) Filed: Apr. 6, 2021

(65) Prior Publication Data

US 2022/0319972 A1 Oct. 6, 2022

(51) Int. Cl.
*H01L 23/552* (2006.01)
*H01L 23/498* (2006.01)
(Continued)

(52) U.S. Cl.
CPC .... *H01L 23/49838* (2013.01); *H01L 21/4857* (2013.01); *H01L 21/56* (2013.01);
(Continued)

(58) Field of Classification Search
CPC ........... H01L 23/49838; H01L 21/4857; H01L 21/56; H01L 23/49822; H01L 23/552; H01L 23/66; H01L 2924/01018; H01L 2924/01032; H01L 2924/01072; H01L 2924/351; H01L 2224/13023; H01L 2224/83101; H01L 23/5227; H01L 2224/02372; H01L 2224/05671; H01L 2224/1146; H01L 2224/48864; H01L 23/367; H01L 23/5329; H01L 2924/01083; H01L 2224/05186; H01L 2924/12044; H01L 21/768; H01L 2224/13014; H01L 2224/48664; H01L 2224/81805; H01L 2224/9202; H01L 2924/01077; H01L 2224/023; H01L 2224/0361; H01L 2224/05027; H01L 2224/05558; H01L 2224/08145; H01L 2225/06524; H01L 24/80; H01L 2223/6677; H01L 2224/05187; H01L 2224/13;
(Continued)

(56) References Cited

U.S. PATENT DOCUMENTS 8,907,498 B2 * 12/2014 Pagaila .................. H01L 23/50
257/784
9,799,619 B2 * 10/2017 Jin .......................... H01L 21/78
(Continued)

*Primary Examiner* — Niki H Nguyen
(74) *Attorney, Agent, or Firm* — FOLEY & LARDNER LLP

(57) ABSTRACT

A semiconductor device package and method for manufacturing the same are provided. The semiconductor device package includes a dielectric layer, an electronic component, a first conductive layer, and a conductive element. The dielectric layer has a first surface and a second surface opposite to the first surface. The electronic component is embedded in the dielectric layer. The first conductive layer is embedded in the dielectric layer and adjacent to the first surface of the dielectric layer. The conductive element is disposed on the first surface of the dielectric layer and in contact with the first conductive layer.

16 Claims, 42 Drawing Sheets

(51) Int. Cl.
*H01L 23/66* (2006.01)
*H01L 21/56* (2006.01)
*H01Q 1/22* (2006.01)
*H01L 21/48* (2006.01)

(52) U.S. Cl.
CPC ...... *H01L 23/49822* (2013.01); *H01L 23/552* (2013.01); *H01L 23/66* (2013.01); *H01Q 1/2283* (2013.01); *H01L 2223/6677* (2013.01)

(58) Field of Classification Search
CPC . H01L 2224/13021; H01L 2224/13294; H01L 2224/133; H01L 2224/81224
See application file for complete search history.

(56) References Cited

U.S. PATENT DOCUMENTS

| | | | |
|---|---|---|---|
| 10,157,834 B1* | 12/2018 | Tang | H01L 23/53233 |
| 2012/0062439 A1* | 3/2012 | Liao | H01L 25/16 |
| | | | 29/25.01 |
| 2013/0075936 A1* | 3/2013 | Lin | H01L 25/105 |
| | | | 438/109 |
| 2018/0012852 A1 | 1/2018 | Kamgaing et al. | |
| 2019/0236326 A1* | 8/2019 | Tai | H01L 21/70 |
| 2021/0098860 A1* | 4/2021 | Kuo | H01L 23/5384 |
| 2021/0225773 A1* | 7/2021 | Bae | H01L 24/20 |

* cited by examiner

SEMICONDUCTOR DEVICE PACKAGE, ANTENNA DEVICE, AND METHOD FOR MANUFACTURING THE SAME

BACKGROUND

1. Field of the Disclosure

The present disclosure relates to a semiconductor device package, an antenna device, and manufacturing methods.

2. Description of the Related Art

A semiconductor device package may include a semiconductor die embedded in a dielectric layer. The pitch of the embedded semiconductor die is much smaller than that of the motherboard. A fan-out structure may be used for connecting the embedded semiconductor die with a motherboard. However, the fan-out structure may include a narrow conductive layer traversing a long distance. The narrow conductive layer may be peeled off during a formation of the fan-out structure. If damaged, the fan-out structure would be unable to connect the embedded semiconductor die with the motherboard.

SUMMARY

In some embodiments, a semiconductor device package includes a dielectric layer, an electronic component, a first conductive layer, and a conductive element. The dielectric layer has a first surface and a second surface opposite to the first surface. The electronic component is embedded in the dielectric layer. The first conductive layer is embedded in the dielectric layer and adjacent to the first surface of the dielectric layer. The conductive element is disposed on the first surface of the dielectric layer and in contact with the first conductive layer.

In some embodiments, an antenna device includes a dielectric layer, an antenna, a first conductive layer, and a conductive element. The dielectric layer has a first surface and a second surface opposite to the first surface. The antenna is disposed on the second surface of the dielectric layer. The first conductive layer is disposed in the dielectric layer. The conductive element is disposed on the first surface of the dielectric layer and electrically connected to the antenna through the first conductive layer. The first conductive layer has a first portion exposed from the conductive element and a second portion in contact with the conductive element.

In some embodiments, a manufacturing method includes providing a dielectric layer and a conductive layer (131) embedded in the dielectric layer; attaching an electronic component to the dielectric layer; and forming a conductive element to be in contact with an exposed surface of the conductive layer, wherein the electronic component is electrically connected to the conductive layer through the conductive element.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
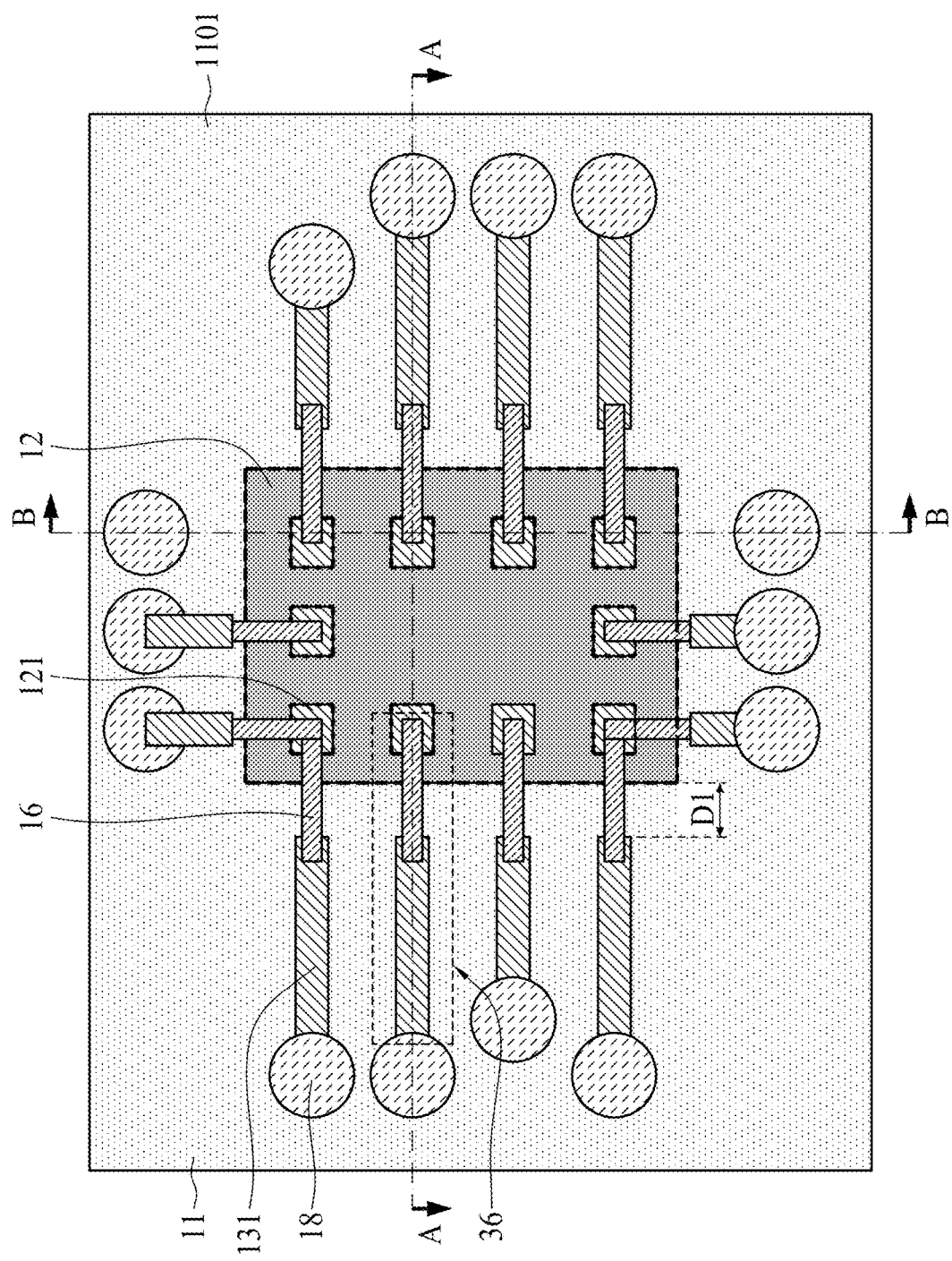
FIG. 1 illustrates a bottom view of a semiconductor device package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, arrangements, or examples, for implementing different features of the provided subject matter. Specific examples of components and arrangements are described below to explain certain features of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, various different embodiments, examples, or arrangements may use a same reference numeral or letter to refer to a same or similar element for the purpose of clarity. Similarly shaded elements correspond to the same type of elements, although some of these elements may not be indicated using a reference numeral for the sake of clarity.

Figure 2:
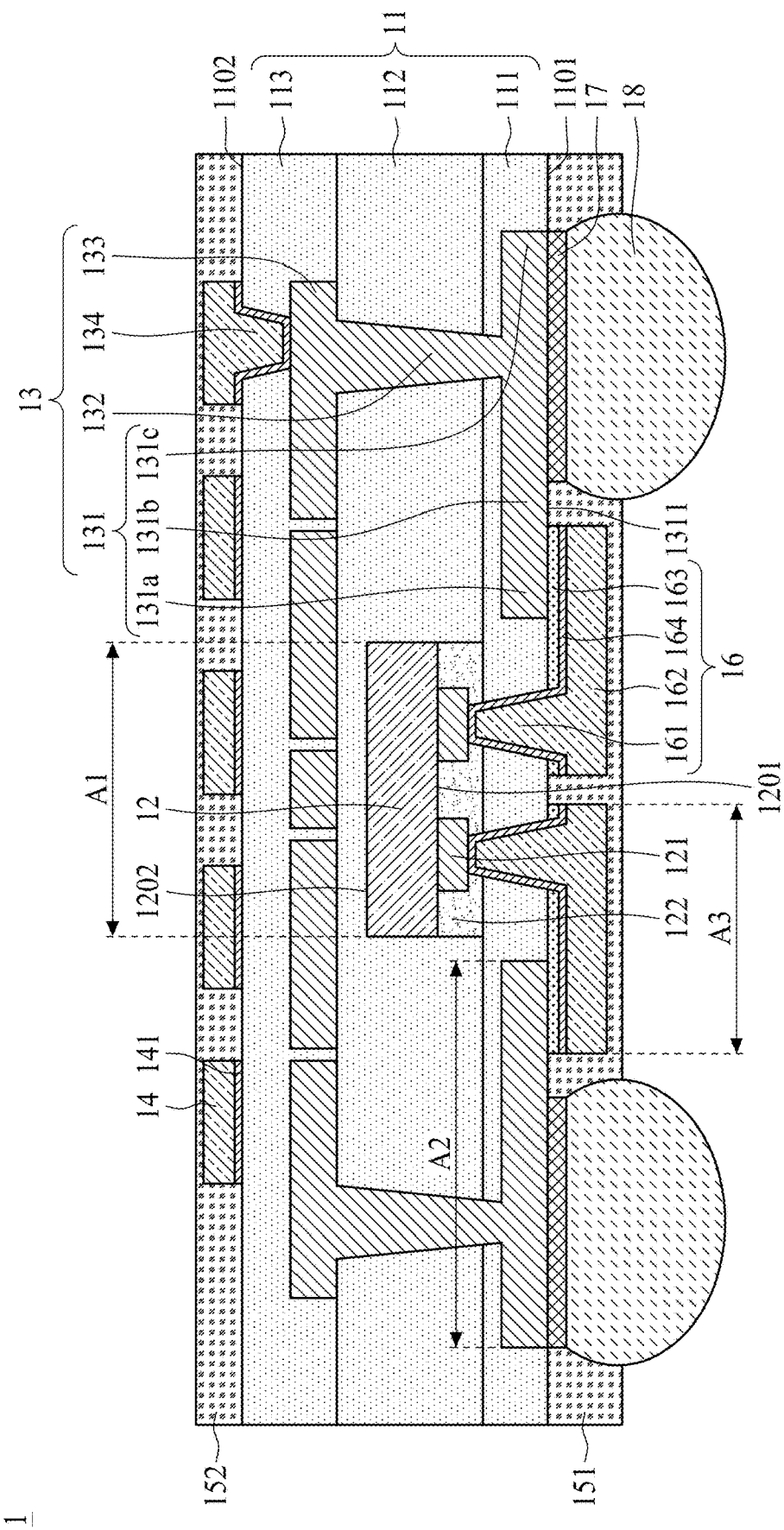
FIG. 2 illustrates a cross-sectional view of a semiconductor device package along the line A-A of FIG. 1.
Figure 3:
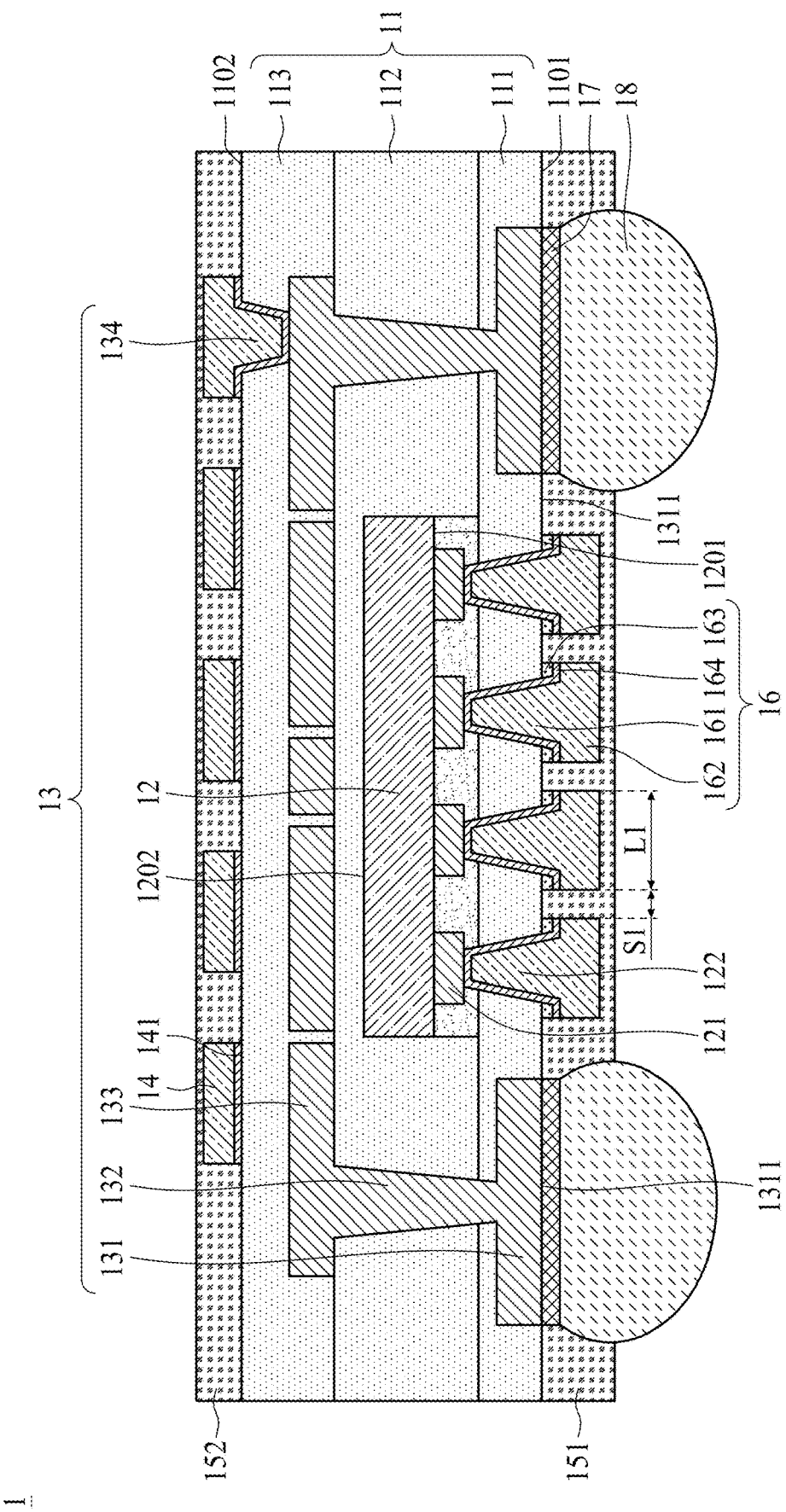
FIG. 3 illustrates a cross-sectional view of a semiconductor device package along the line B-B of FIG. 1.

FIG. 1 illustrates a bottom view of a semiconductor device package (e.g., an antenna device) 1 according to some embodiments of the present disclosure. FIG. 2 illustrates a cross-sectional view of the semiconductor device package 1 along the line A-A of FIG. 1. FIG. 3 illustrates a cross-sectional view of the semiconductor device package 1 along the line B-B of FIG. 1. The semiconductor device package 1 includes a dielectric layer 11, an electronic component 12, a conductive trace 13, an antenna 14, an insulation layer 151, an insulation layer 152, a conductive element 16, a conductive pad 17, and a connection element 18. For clarity, the insulation layer 151 may be omitted in the bottom view of the semiconductor device package 1 as illustrated in FIG. 1.

As shown in FIG. 2, the dielectric layer 11 may include multiple layers. For example, the dielectric layer 11 may include a portion 111, a portion 112 disposed on the portion 111, and a portion 113 disposed on the portion 112. The dielectric layer 11 may have a surface 1101 and a surface 1102 opposite the surface 1101. The material of the dielectric layer 11 may include, for example, an organic material, such as a solder mask, a polyimide (PI), an Ajinomoto build-up film (ABF), and one or more molding compounds. The material of the dielectric layer 11 may include, for example, an inorganic material silicon-oxide ($SiO_x$), or a silicon-nitride ($SiN_x$).

The electronic component 12 is embedded in the dielectric layer 11. For example, the electronic component 12 is disposed on the portion 111 of the dielectric layer 11 and covered or encapsulated by the portion 112 of the dielectric layer 11. The electronic component 12 may have an active surface 1201 facing away from the antenna 14 and have a backside surface 1202 facing the antenna 14. The electronic component 12 may have a plurality of conductive pads 121 disposed on the active surface 1201 and a dielectric layer 122 disposed on the active surface 1201. The conductive pads 121 may be partially covered by the dielectric layer 122. The electronic component 12 may include, for example, one or more of a processor, logic die, application specific integrated circuit (ASIC), an input/output device, radio frequency (RF) device etc.

The conductive trace 13 may include a conductive layer 131, a conductive via 132 disposed on the conductive layer 131, a conductive layer 133 disposed on the conductive via 132, and a conductive via 134 disposed between the conductive layer 133 and the antenna 14. The conductive layer 131 may be embedded in the dielectric layer 11 (e.g., the portion 111) and adjacent to the surface 1101 of the dielectric layer 11. The conductive layer 131 may have a surface 1311 exposed from the surface 1101 of the dielectric layer 11. The conductive layer 131 may be electrically coupled to the conductive layer 133 through the conductive via 132. The conductive layer 133 may be embedded in the dielectric layer 11 (e.g., the portion 113) and adjacent to the surface 1102 of the dielectric layer 11. The conductive layer 133 may be electrically coupled to the antenna 14 through the conductive via 134. The conductive layer 131 may be electrically coupled to the antenna 14, e.g., through the conductive via 134, the conductive layer 133, and the conductive via 132. The conductive layer 133 may include a shielding layer disposed between the electronic component 12 and the antenna 14. The shielding layer can block electromagnetic waves from the antenna 14 to prevent the electronic component 12 from being influenced by electromagnetic waves. In some embodiments, the shielding layer may have a discontinuous pattern which has a space smaller than a half of a wavelength of the electromagnetic wave. In an alternative embodiment, the shielding layer may have a blanket pattern.

The conductive via 132, the conductive layer 133, and the conductive via 134 may each include a seed layer. The conductive layer 131 may exclude a seed layer. The conductive layer 131, the conductive layer 132, the conductive layer 133, and the conductive via 134 may each include, for example, metal such as copper, aluminum, gold, nickel, titanium, and/or other suitable materials.

The antenna 14 is disposed on the surface 1102 of the dielectric layer 11. The antenna 14 can be configured to emit or receive electromagnetic waves. In some embodiments, the antenna 14 may include a plurality of antenna units arranged in an array. In some embodiments, the antenna 14 may include a conductive material such as a metal or metal alloy. Examples of the conductive material include gold, silver, aluminum, copper, or an alloy thereof As shown in FIG. 2, the conductive element 16 may be disposed on the surface 1101 of the dielectric layer 11. The conductive element 16 may be in contact with the conductive layer 131. The conductive layer 13 may include a portion 131a in contact with the conductive element 16 and a portion 131b exposed from the conductive element 16. The conductive layer 13 may include a portion 131c in contact with the conductive pad 17. As shown in FIG. 3, the conductive element 16 may have a line L1 and be spaced with another conductive element 16 with a space S1. The line L1 and the space S1 may be relatively small.

In some embodiments, the conductive element 16 may include a conductive via 161 extending through the portion 111 of the dielectric layer 11 and in contact with the conductive pads 121 of the electronic component 12. The conductive element 16 may include a conductive layer 162 connected to the conductive via 161. The conductive layer 162 may disposed on the conductive via 161. The conductive element 16 may include a seed layer 163 disposed on the surface 1311 of the conductive layer 131 and the surface 1101 of the dielectric layer 11. The seed layer 163 may be in contact with the conductive layer 131 and the dielectric layer 11. The conductive element 16 may include a seed layer 164 disposed on the seed layer 163. The seed layer 164 may be disposed along a sidewall of the conductive via 161. In other words, the seed layers 163 and 164 may be referred to as a multiple seed layer that is disposed between the conductive layer 162 and the conductive layer 131 or between the conductive layer 162 and the dielectric layer 11. The seed layer 164 may be referred to as a single seed layer disposed along the sidewall of the conductive via 161.

Referring to FIG. 1, the electronic component 12 may have a displacement D1 relative to the conductive layer 131 in a direction substantially parallel with the surface 1101 of the dielectric layer 11. In other words, the electronic component 12 may be physically separated from the conductive layer 131. As shown in FIG. 1 and FIG. 2, owing to the existence of the conductive element 16, the embedded electronic component 12 may be electrically coupled to the embedded conductive layer 131. An electrical path may be established among the electronic component 12, the conductive element 16, and the conductive layer 131. Furthermore, the conductive element 16 may be electrically connected to the antenna 14 through the conductive layer 131.

The connection element 18 may be disposed on the conductive pad 17. The connection element 18 may be electrically coupled with the conductive layer 131 through the conductive pad 17. In some embodiments, the conductive layer 133 (e.g., the shielding layer) may be grounded through the connection element 18. The conductive pad 17 may include, for example, a conductive material such as a metal. Examples of the conductive material include gold, silver, aluminum, or copper. The connection element 18 may include, for example, a solder ball or a controlled collapse chip connection (C4) bump.

The connection element 18 may be configured to connect to one or more conductive pads of a substrate, e.g., a printed circuit board (not shown in FIG. 2). A pitch of the conductive pads of the substrate may be greater than that of the conductive pads 121 of the electronic component 12. As shown in FIG. 1, the embedded conductive layer 13 and the conductive element 16 may be a fan-out structure 36 for the connection between the electronic component 12 and the substrate (or the connection element 18). The fan-out structure 36 may have a relatively small or narrow line/space (e.g., the line L1 and the space S1 in FIG. 3). The fan-out structure 36 has an embedded portion in the dielectric layer 11 (e.g., the conductive layer 131). As such, the risks of the narrow-in-line/space fan-out structure peel-off during the formation of an exposed portion (e.g., the conductive element 16) can be significantly reduced. The ratio of the embedded portion and the exposed portion may be about 10%, 20%, 30%, 40%, 50%, 60%, 70%, 80%, 90%, or more.

In some comparative embodiments, a semiconductor device package may include a semiconductor die embedded in a dielectric layer. The pitch of the embedded semiconductor die is much smaller than that of the motherboard. A fan-out structure may be disposed to connect the embedded semiconductor die with a motherboard. However, the fan-out structure may include a narrow-in-line/space conductive layer traversing in a long distance on the dielectric layer. It is highly possible that such a conductive layer may be peeled off in a formation of the fan-out structure. For example, the formation of the fan-out structure may include a flash etching spray process in which a seed layer of the conductive layer would be removed. Due to the narrow-in-line/space, the conductive layer may be easily peeled when removing the seed layer. The damaged fan-out structure would not be used for connecting the embedded semiconductor die with the motherboard. In the present disclosure, the fan-out structure 36 has the embedded portion (e.g., conductive layer 131) traversing in the dielectric layer 11. The fan-out structure 36 has less portions standing on the dielectric layer than that of the comparative embodiments. In the flash spray etch process, the probability of peel-off for the fan-out structure 36 can be suppressed. Thus, the risk of fan-out structure damage can be significantly reduced.

Referring to FIG. 2, the electronic component 12 may have a projection area A1 on the surface 1101 of the dielectric layer 11 and the conductive layer 131 may have a projection area A2 on the surface 1101 of the dielectric layer 11. There may be an absence of overlap between the projection A1 of the electronic component 12 and the projection A2 of the conductive layer 13. The conductive element 16 may have a projection area A3 on the surface 1101 of the dielectric layer 11. The projection area A1 of the electronic component 12 may overlap with a first portion of the projection area A3 of the conductive element 16. The projection area A2 of the conductive layer 13 may overlap with a second portion of the projection area A3 of the conductive element 16. The second portion of the projection area A3 is different from the first portion of the projection area A3.

The insulation layer 151 may be disposed on the surface 1101 of the dielectric layer 11. The surface 1101 of the dielectric layer 11 may be covered by the insulation layer 151. The conductive element 16 may be covered by the insulation layer 151. The insulation layer 151 may be in contact with the connection element 18. In an alternative embodiment, the insulation layer 151 may be spaced apart from the connection element 18. The insulation layer 152 may be disposed on the surface 1102 of the dielectric layer 11. The surface 1102 of the dielectric layer 11 may be covered by the insulation layer 152. The antenna 14 may be covered by the insulation layer 152. The material of the insulation layer 151 and the insulation layer 152 may each include, for example, an organic material, such as a solder mask, a PI, an ABF, one or more molding compounds.

Figure 4:
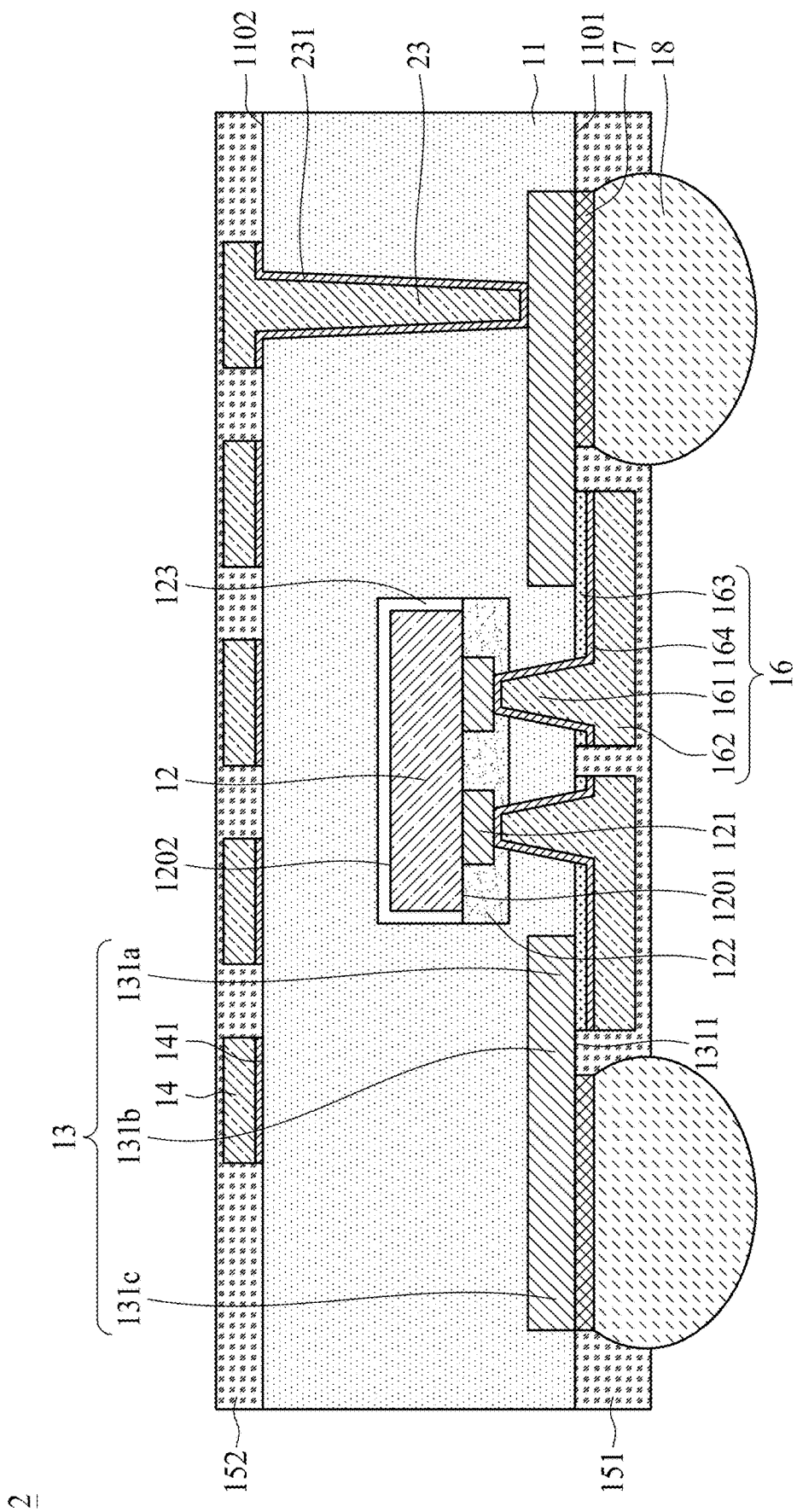
FIG. 4 illustrates a cross-sectional view of a semiconductor device package according to some embodiments of the present disclosure.

FIG. 4 illustrates a cross-sectional view of a semiconductor device package 2 according to some embodiments of the present disclosure. The semiconductor device package 2 of FIG. 4 is similar to the semiconductor device package 1 of FIG. 1, FIG. 2, and FIG. 3; and the differences therebetween are described below.

The electronic component 12 further includes a shielding structure 123 disposed on the backside surface 1202 and a lateral surface of the electronic component 12. A body of the electronic component 12 may be covered by the shielding structure 123. The shielding layer 123 may block electromagnetic waves from the antenna 14 so that the electronic component 12 is not influenced by electromagnetic waves. Meanwhile, a conductive layer (e.g., the conductive layer 133 of FIG. 2) may optionally not be disposed between the antenna 14 and the electronic component 12. The electronic component 12 may include a conductive via 23 extending from the conductive layer 131 to the antenna 14. The antenna 14 may be electrically coupled with the conductive layer 131 through the conductive via 23. The conductive via 23 may include a seed layer 231 disposed along its sidewall. The conductive via 23 may include, for example, metal such as copper, aluminum, gold, nickel, titanium, and/or other suitable materials.

Figure 5:
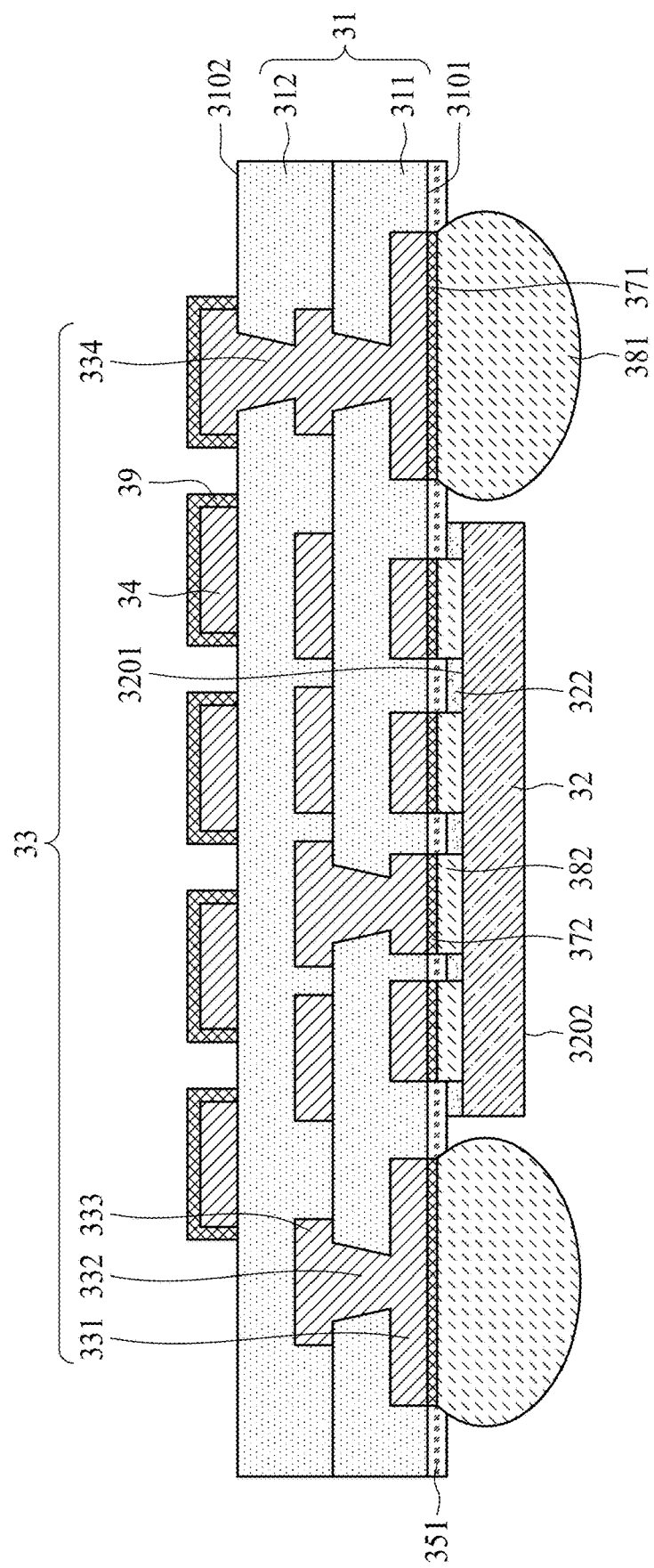
FIG. 5 illustrates a cross-sectional view of a semiconductor device package according to some embodiments of the present disclosure.

FIG. 5 illustrates a cross-sectional view of a semiconductor device package 3 according to some embodiments of the present disclosure. The semiconductor device package 3 may include a dielectric layer 31, a semiconductor die 32, a conductive trace 33, an antenna 34, an insulation layer 351, a conductive pad 371, a conductive pad 372, a connection element 381, a connection element 382, and a metal conductive layer 39.

The dielectric layer 31 may include a material similar to the dielectric layer 11. The conductive trace 33 may include a material similar to the conductive trace 13. The antenna 34 may include a material similar to the antenna 14. The insulation layer 351 may include a material similar to the insulation layer 151. The conductive pad 37 may include a material similar to the conductive pad 17. The conductive element 381 and the conductive element 382 may each include a material similar to the conductive element 18. The conductive layer 39 may include a material similar to the conductive pad 17.

As shown in FIG. 5, the dielectric layer 31 may include a portion 311 and a portion 312 disposed on the portion 311. The dielectric layer 31 may have a surface 3101 and a surface 3102 opposite the surface 3101.

The semiconductor die 32 is disposed on the surface 3101 of the dielectric layer 31. The semiconductor may have an active surface 3201 facing the antenna 14. The semiconductor die 32 may have a dielectric layer 322 disposed on the active surface 1201. The connection element 382 may be covered by the dielectric layer 122. The connection element 382 may be connected to a circuit or a processor of the semiconductor die 32. The semiconductor die 32 may include, for example, one or more of a processor, logic die, application specific integrated circuit (ASIC), input/output device, radio frequency (RF) device etc.

The conductive trace 33 may include a conductive layer 331, a conductive via 332 disposed on the conductive layer 331, a conductive layer 333 disposed on the conductive via 332, a conductive via 334 disposed between the conductive layer 333 and the antenna 34. The conductive layer 331 may be embedded in the dielectric layer 31 (e.g., the portion 311) and adjacent to the surface 3101 of the dielectric layer 31.

The conductive layer 331 may be in contact with the conductive pad 371 or the conductive pad 372. The conductive layer 331 may be electrically coupled to the conductive layer 333 through the conductive via 332. The conductive layer 333 may be embedded in the dielectric layer 31 (e.g., the portion 312) and adjacent to the surface 3102 of the dielectric layer 31. The conductive layer 333 may be electrically coupled to the antenna 34 through the conductive via 334. The conductive layer 333 may include a shielding layer disposed between the semiconductor die 32 and the antenna 34. The shielding layer may block electromagnetic waves from the antenna 34 so that the semiconductor die 32 is not influenced by the electromagnetic waves. In some embodiments, the shielding layer may have a discontinuous pattern which has a space smaller than half of a wavelength of the electromagnetic wave. In an alternative embodiment, the shielding layer may have a blanket pattern.

The conductive via 332, the conductive layer 333, the conductive via 344 may each include a seed layer. The conductive layer 332 may exclude a seed layer. The conductive layer 331, the conductive via 332, the conductive layer 333, and the conductive via 334 may each include, for example, metal such as copper, aluminum, gold, nickel, titanium, and/or other suitable materials. In some embodiments, the antenna 34 may include a conductive material such as a metal or metal alloy. Examples of the conductive material include gold, silver, aluminum, copper, or an alloy thereof.

The semiconductor die 32 may be electrically coupled with the conductive layer 331 through the conductive pad 372 and connection element 382. A substrate (not shown in FIG. 5) may be electrically coupled with the conductive layer 331 through the conductive pad 371 and connection element 381. The substrate may be electrically coupled with the semiconductor die 32 through the conductive layer 331.

The insulation layer 351 may be disposed on the surface 3101 of the dielectric layer 31. The surface 3101 of the dielectric layer 31 may be covered by the insulation layer 351. The conductive pad 371 and the conductive pad 372 may be covered by the insulation layer 351. The insulation layer 351 may be in contact with the connection element 381 or the connection element 382. In an alternative embodiment, the insulation layer 351 may be spaced apart from the connection element 381 or the connection element 382.

The conductive layer 39 may cover the antenna 34. The conductive layer 39 can protect the antenna 34 from oxidation.

Figure 6:
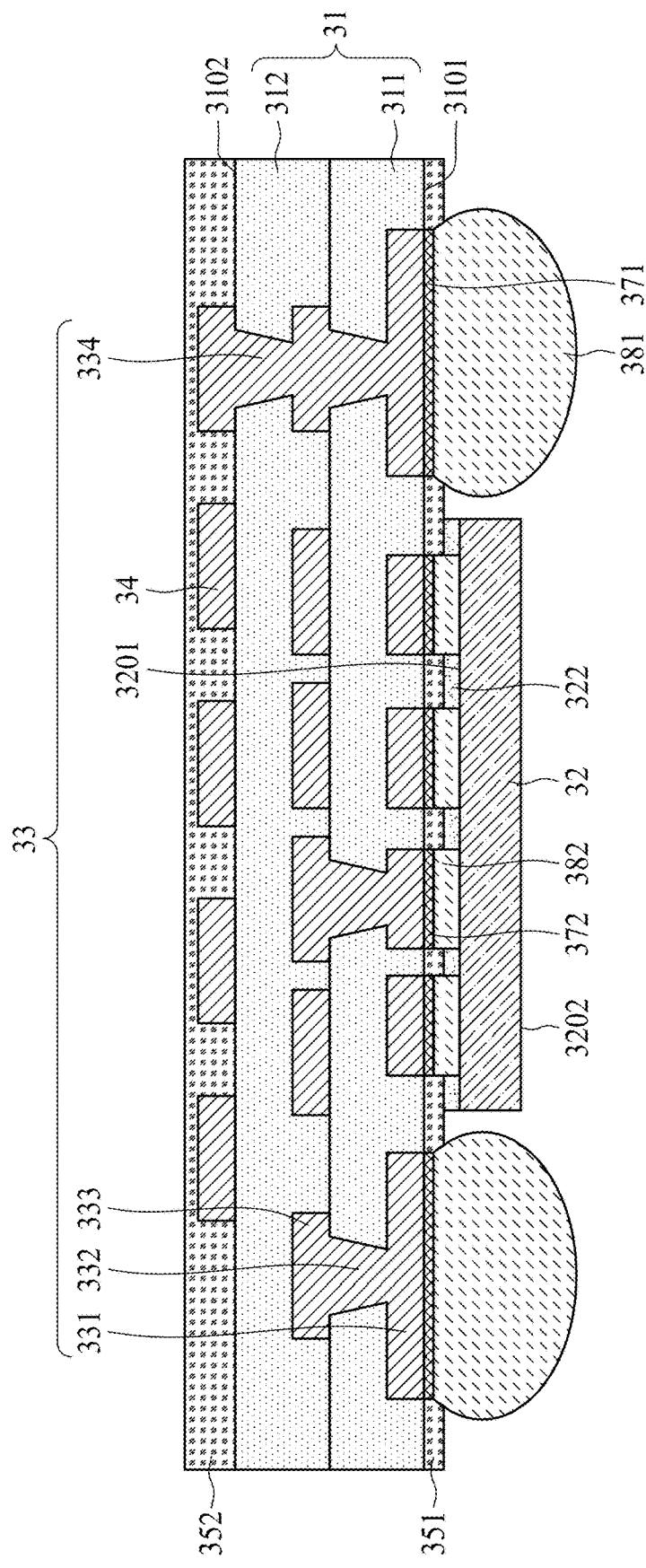
FIG. 6 illustrates a cross-sectional view of a semiconductor device package according to some embodiments of the present disclosure.

FIG. 6 illustrates a cross-sectional view of a semiconductor device package 4 according to some embodiments of the present disclosure. The semiconductor device package 4 of FIG. 6 is similar to the semiconductor device package 3 of FIG. 5; the differences therebetween are described below.

The semiconductor device package 4 further includes an insulation layer 352 disposed on the surface 3202 of the dielectric layer 31. The antenna 34 may be covered by the insulation layer 352, instead of the conductive layer 39. The insulation layer 352 can protect the antenna 34 from oxidation. The insulation layer 352 may include a material similar to the insulation layer 152.

FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, FIG. 23, and FIG. 24 each illustrate one or more stages of an example of a method for manufacturing a semiconductor device package according to some embodiments of the present disclosure. In some embodiments, the method is for manufacturing the semiconductor device package 1 shown in FIG. 1, FIG. 2, and FIG. 3.

FIG. 25, FIG. 26, FIG. 27, FIG. 28, FIG. 29, FIG. 30, FIG. 31, FIG. 32, FIG. 33, FIG. 34, FIG. 35, FIG. 36, FIG. 37, FIG. 38, FIG. 39, FIG. 40, FIG. 41, and FIG. 42 each illustrate one or more stages of an example of a method for manufacturing a semiconductor device package according to some embodiments of the present disclosure. In some embodiments, the method is for manufacturing the semiconductor device package 1 shown in FIG. 1, FIG. 2, and FIG. 3.

The stages illustrated in FIG. 7 through FIG. 24 correspond to the stages illustrated in FIG. 25 through FIG. 42, respectively. The structures illustrated in FIG. 7 through FIG. 24 are identical to the structures illustrated in FIG. 25 through FIG. 42, but are viewed from a different perspective. For example, FIGS. 7 through 24 illustrate cross-sectional views of structures in the same direction as line A-A of FIG. 1. FIGS. 25 through 42 illustrate cross-sectional views of structures in the same direction as line B-B of FIG. 1. Thus, the stages of FIGS. 7 through 24 and FIGS. 25 through 42 will be described concurrently for the sake of simplicity.

Figure 7:
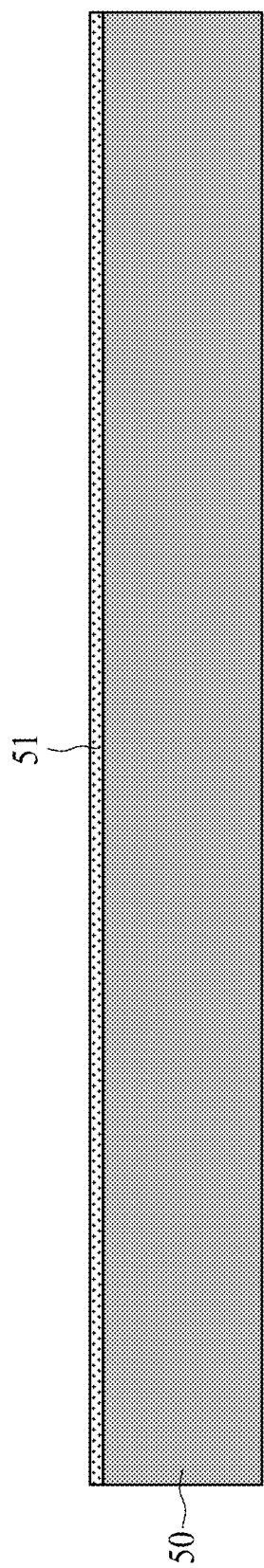
FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, FIG. 23, and FIG. 24 each illustrate one or more stages of an example of a method for manufacturing a semiconductor device package according to some embodiments of the present disclosure.
Figure 25:
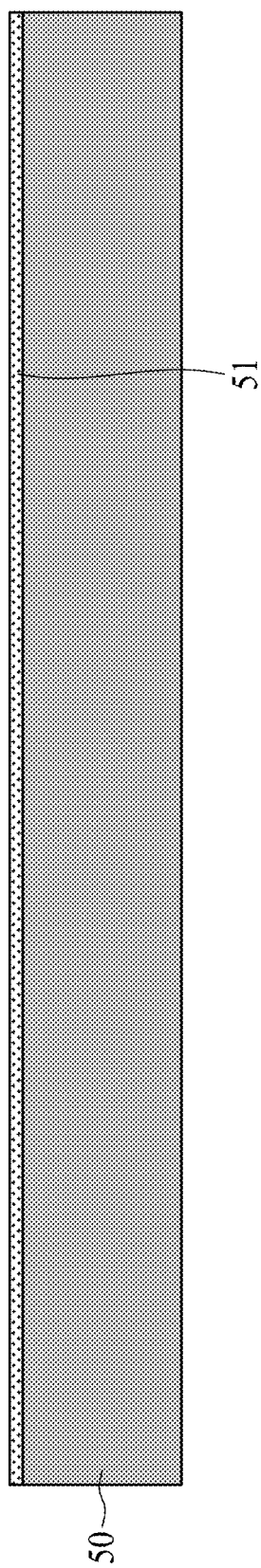
FIG. 25, FIG. 26, FIG. 27, FIG. 28, FIG. 29, FIG. 30, FIG. 31, FIG. 32, FIG. 33, FIG. 34, FIG. 35, FIG. 36, FIG. 37, FIG. 38, FIG. 39, FIG. 40, FIG. 41, and FIG. 42 each illustrate one or more stages of an example of a method for manufacturing a semiconductor device package according to some embodiments of the present disclosure.

Referring to FIG. 7 and FIG. 25, a carrier 50 may be provided. A seed layer 51 may be formed on the carrier 50. The seed layer 51 may include a metal foil, an electroplating metal, or the like.

Figure 8:
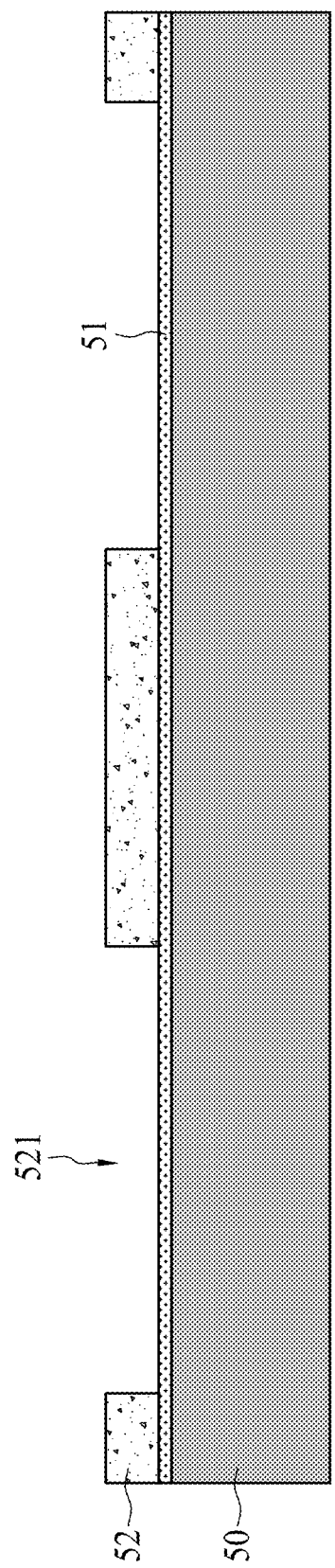
Figure 26:
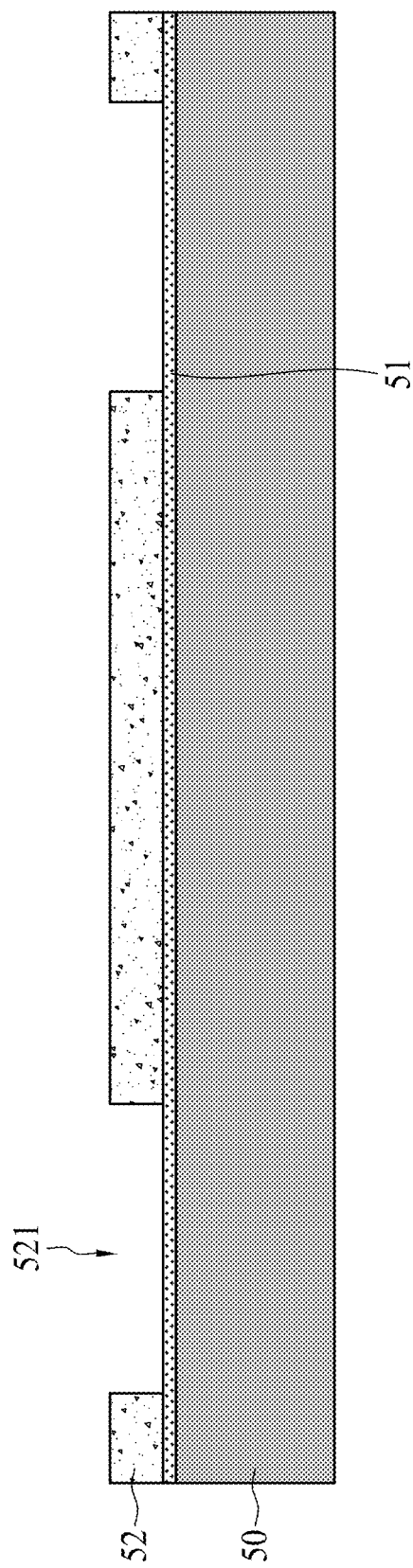

Referring to FIG. 8 and FIG. 26, a photo resist 52 may be formed and patterned on the seed layer 51. The photo resist 52 may define a region 521 exposing the seed layer 51.

Figure 9:
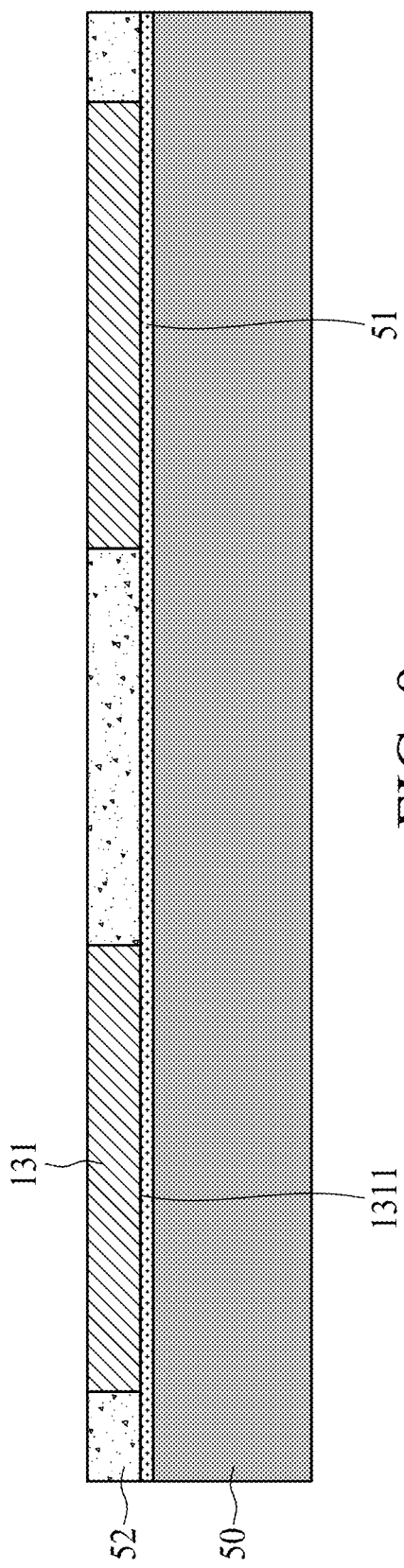
Figure 27:
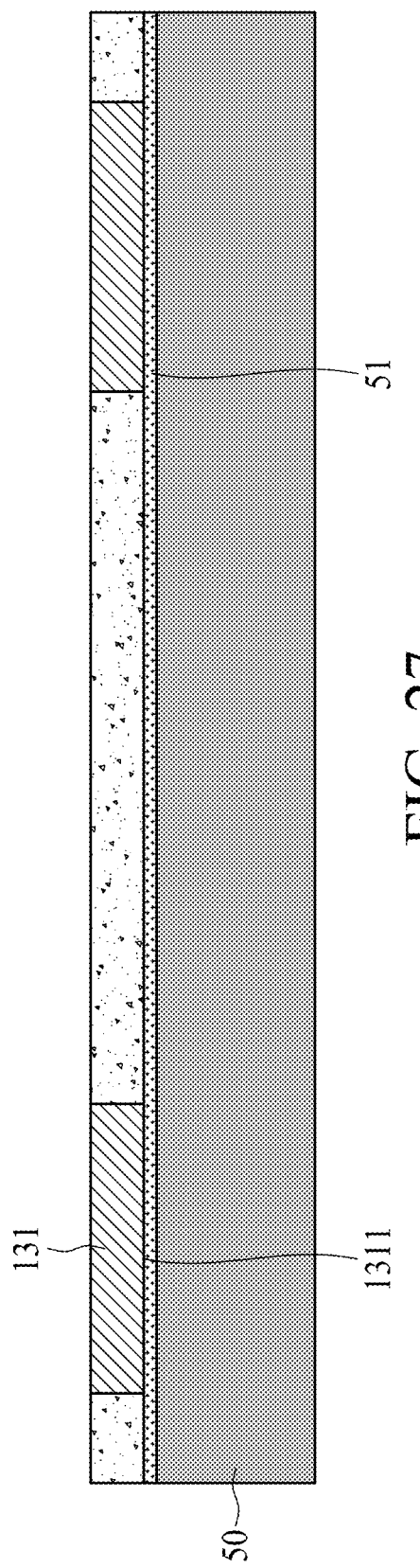

Referring to FIG. 9 and FIG. 27, a conductive layer 131 may be formed in the region 521 by, for example but not limited to, an electroplating process. The conductive layer 131 may have a surface 1311 in contact with the seed layer 151.

Figure 10:
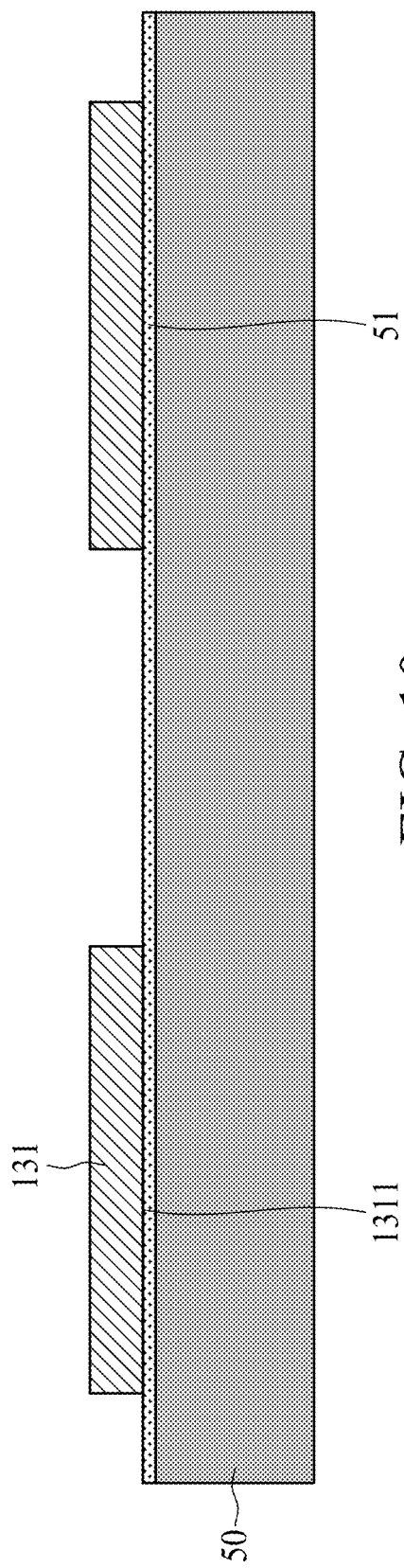
Figure 28:
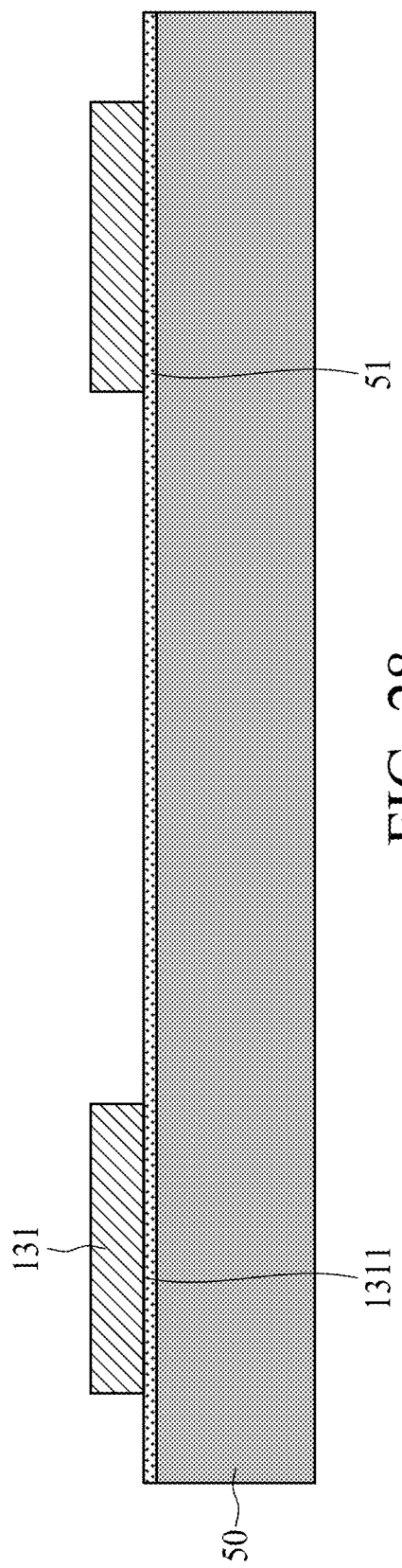

Referring to FIG. 10 and FIG. 28, the photo resist 52 may be removed by an etch process. The seed layer 51 may have a portion exposed from the conductive layer 131.

Figure 11:
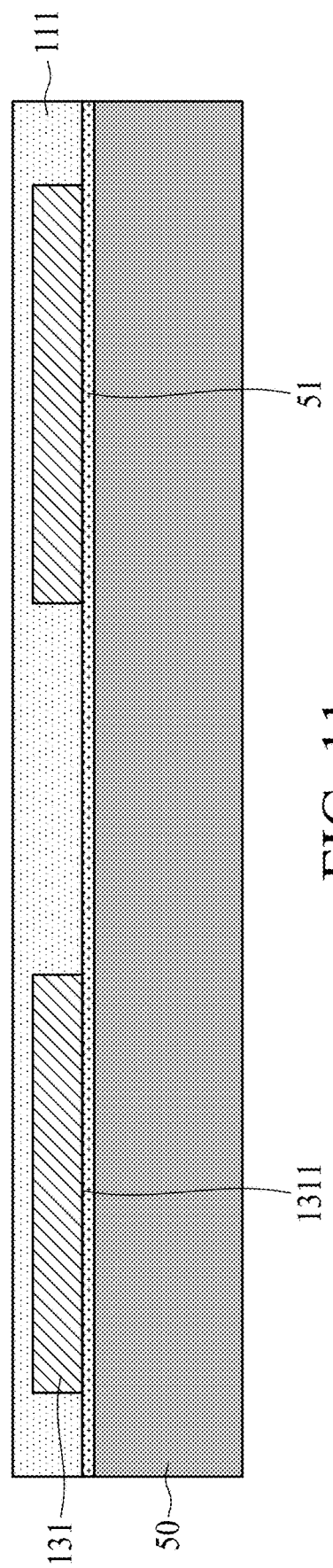
Figure 29:
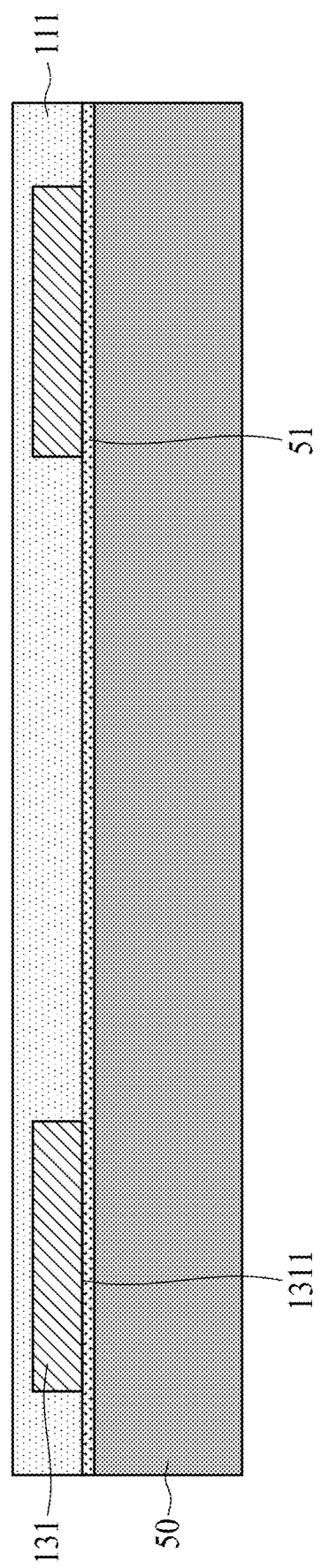

Referring to FIG. 11 and FIG. 29, a dielectric layer 111 may be formed on the seed layer 51. The conductive layer 131 may be embedded by the dielectric layer 111. The seed layer 51 may be covered by the dielectric layer 111.

Figure 12:
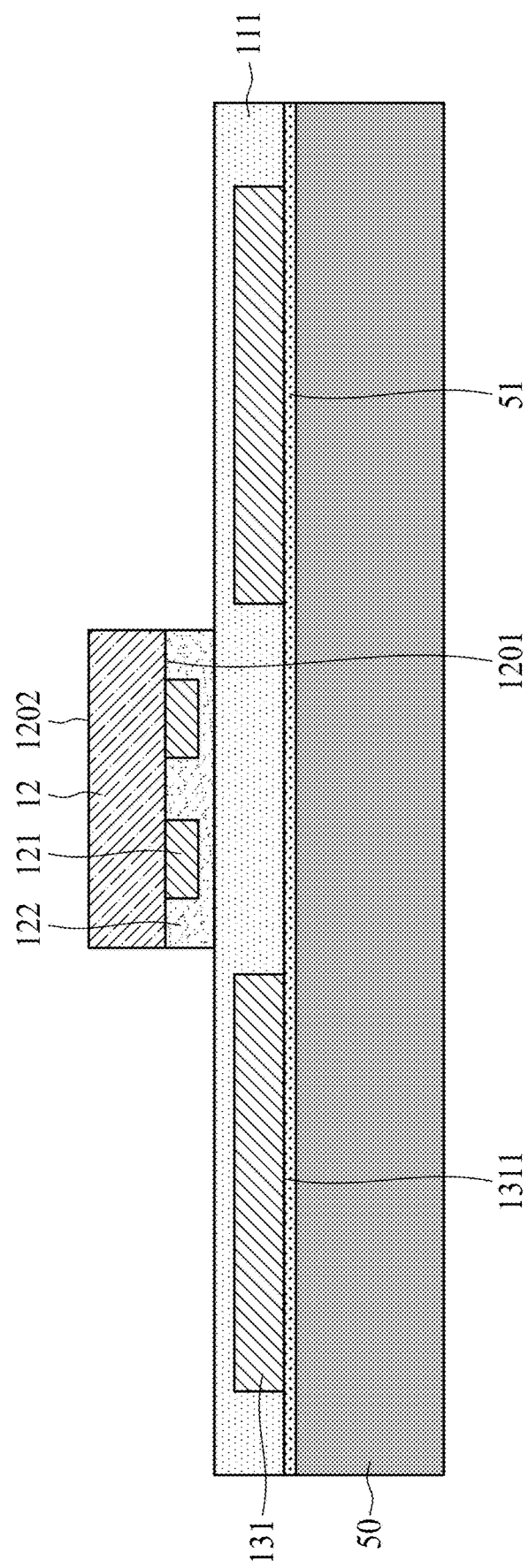
Figure 30:
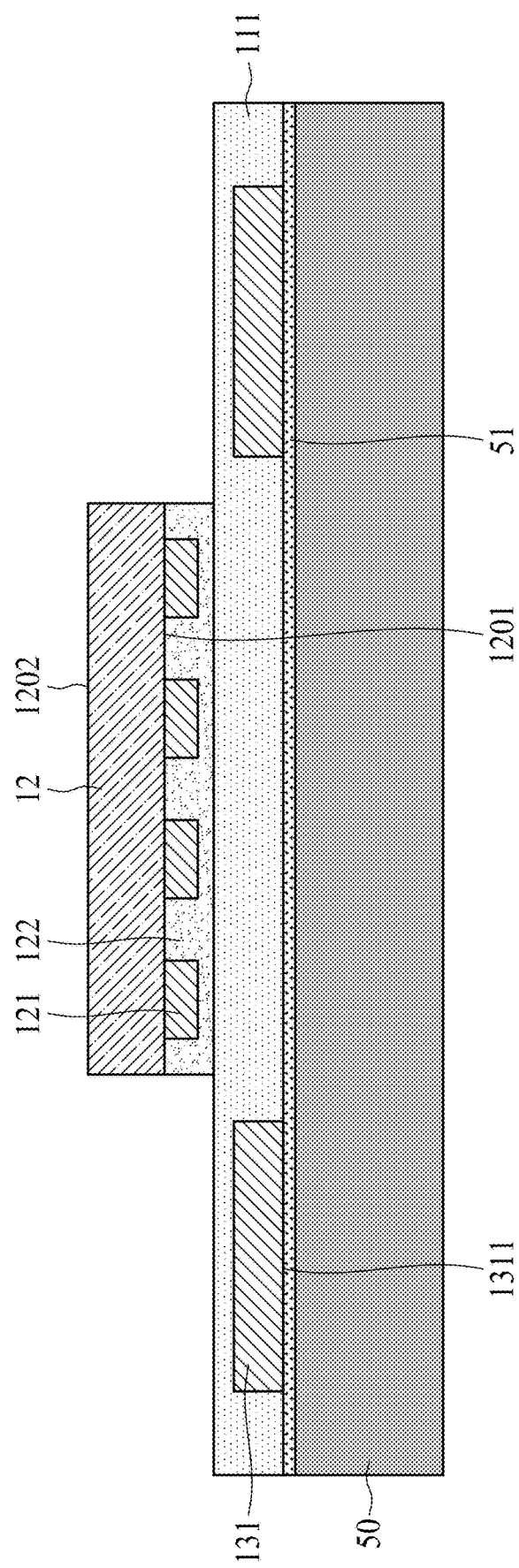

Referring to FIG. 12 and FIG. 30, an electronic component 12 may be attached to the dielectric layer 111. The electronic component 12 may have an active surface 1201 facing the seed layer 51 and a backside surface 1202 opposite the active surface 1201. The electronic component 12 may include a plurality of conductive pads 121 disposed on the active surface 1201 and a dielectric layer 122 disposed on the active surface 1201 and covering the conductive pads 121.

Figure 13:
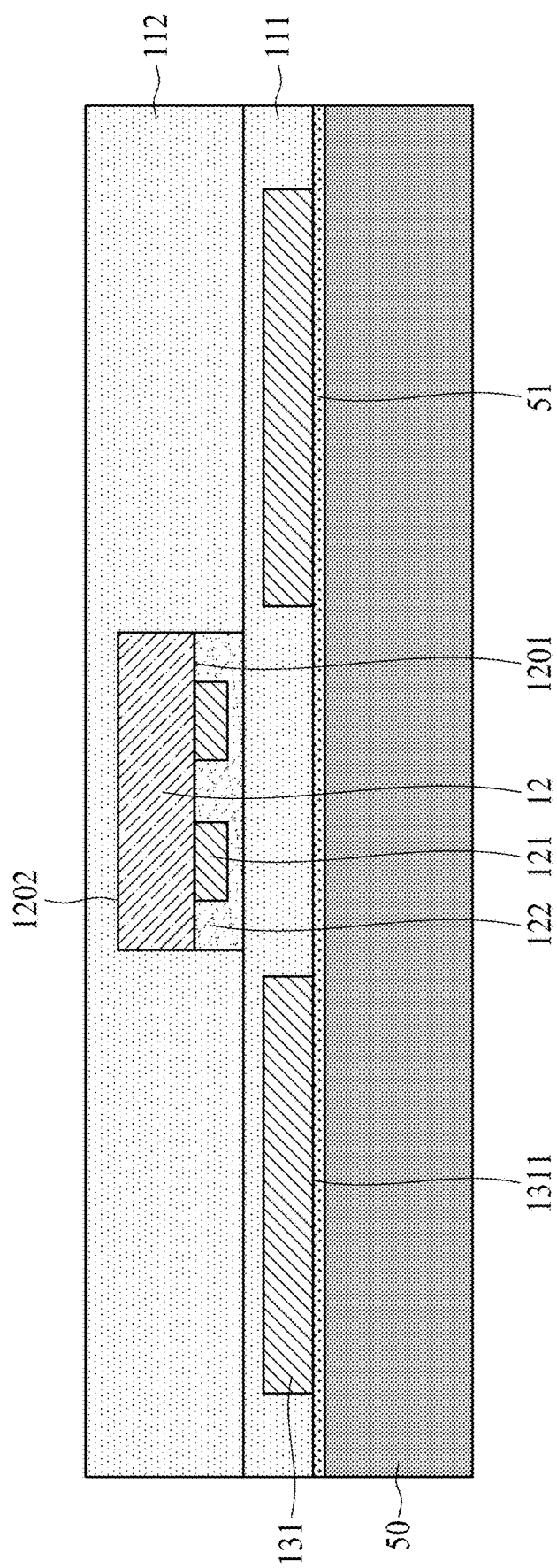
Figure 31:
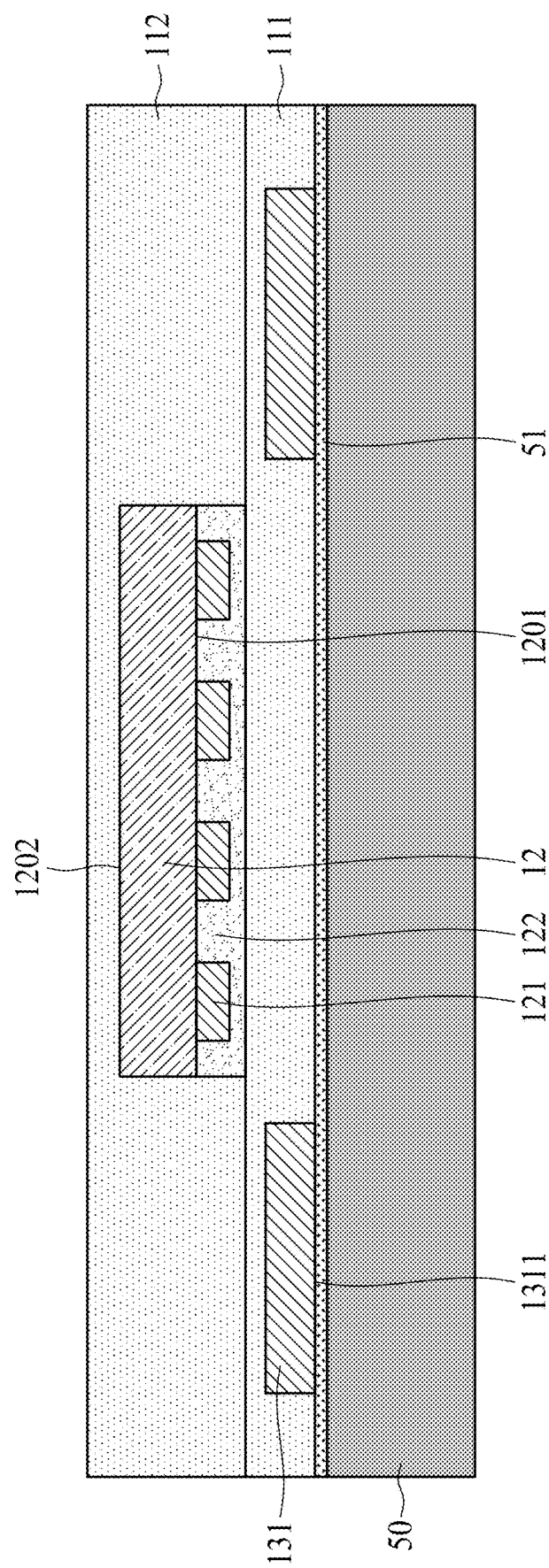

Referring to FIG. 13 and FIG. 31, a dielectric layer 112 may be formed on the dielectric layer 111. The electronic component 12 may be embedded by the dielectric layer 112.

Figure 14:
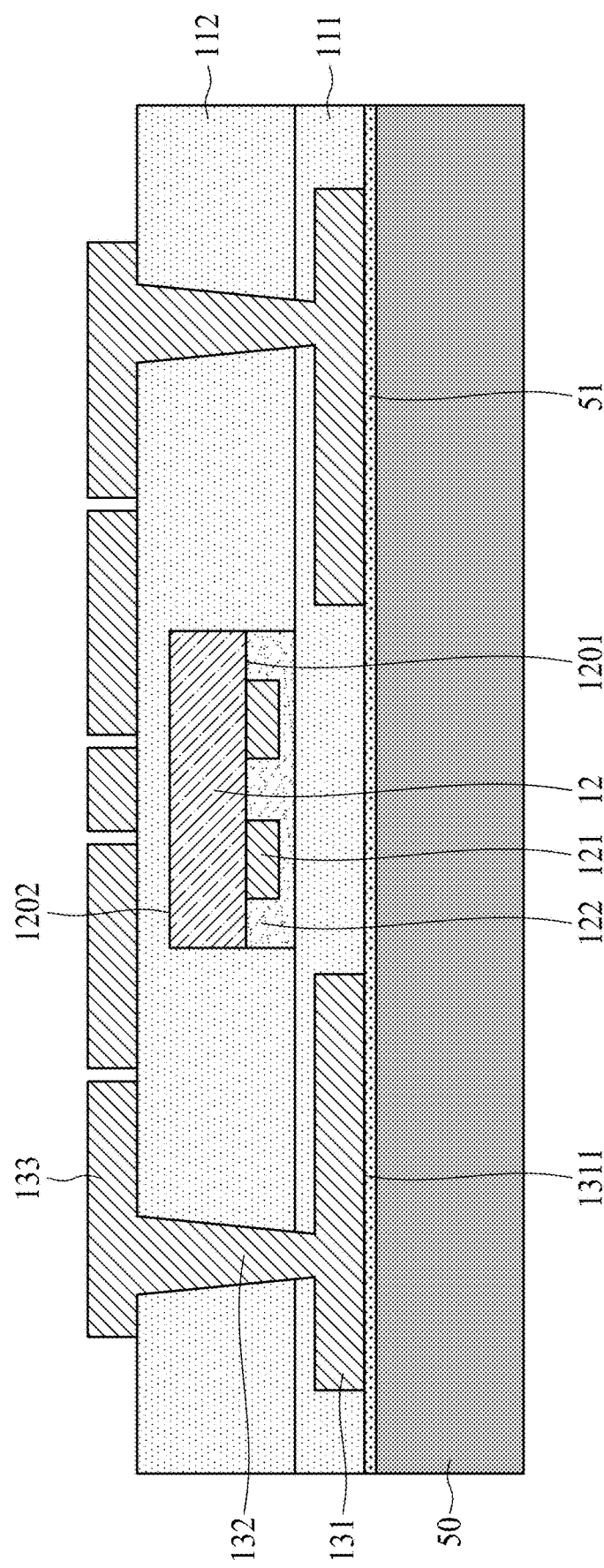
Figure 32:
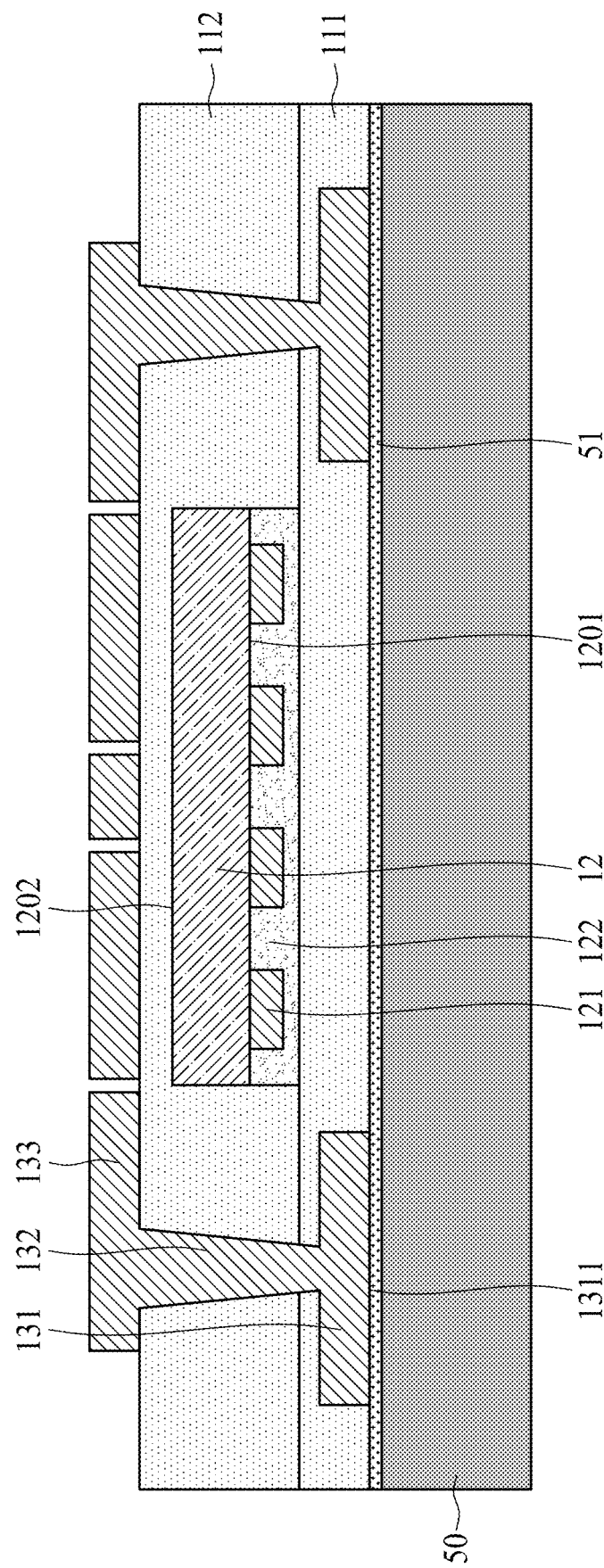

Referring to FIG. 14 and FIG. 32, a conductive via 132 may be formed in the dielectric layer 111 and the dielectric layer 112. A conductive layer 133 may be formed on the dielectric layer 112. The conductive via 132 may extend from the conductive layer 131 to the conductive layer 133.

Figure 15:
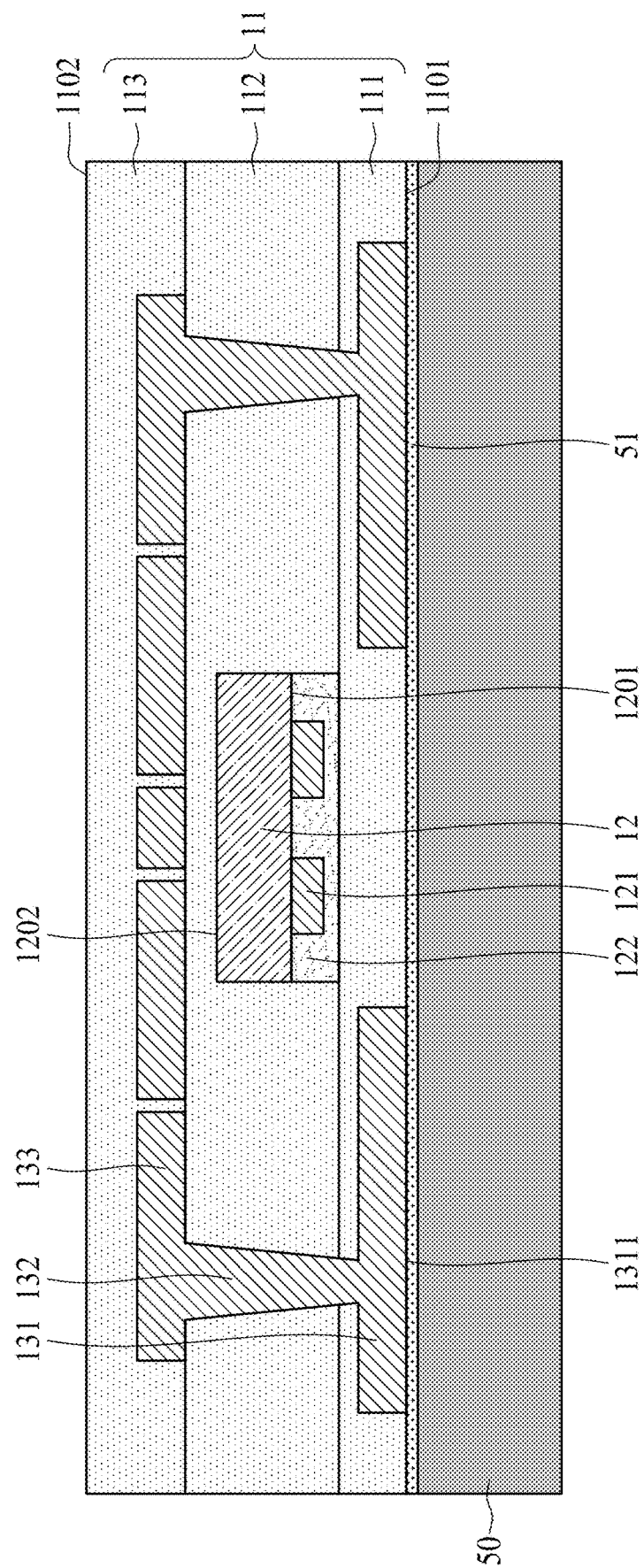
Figure 33:
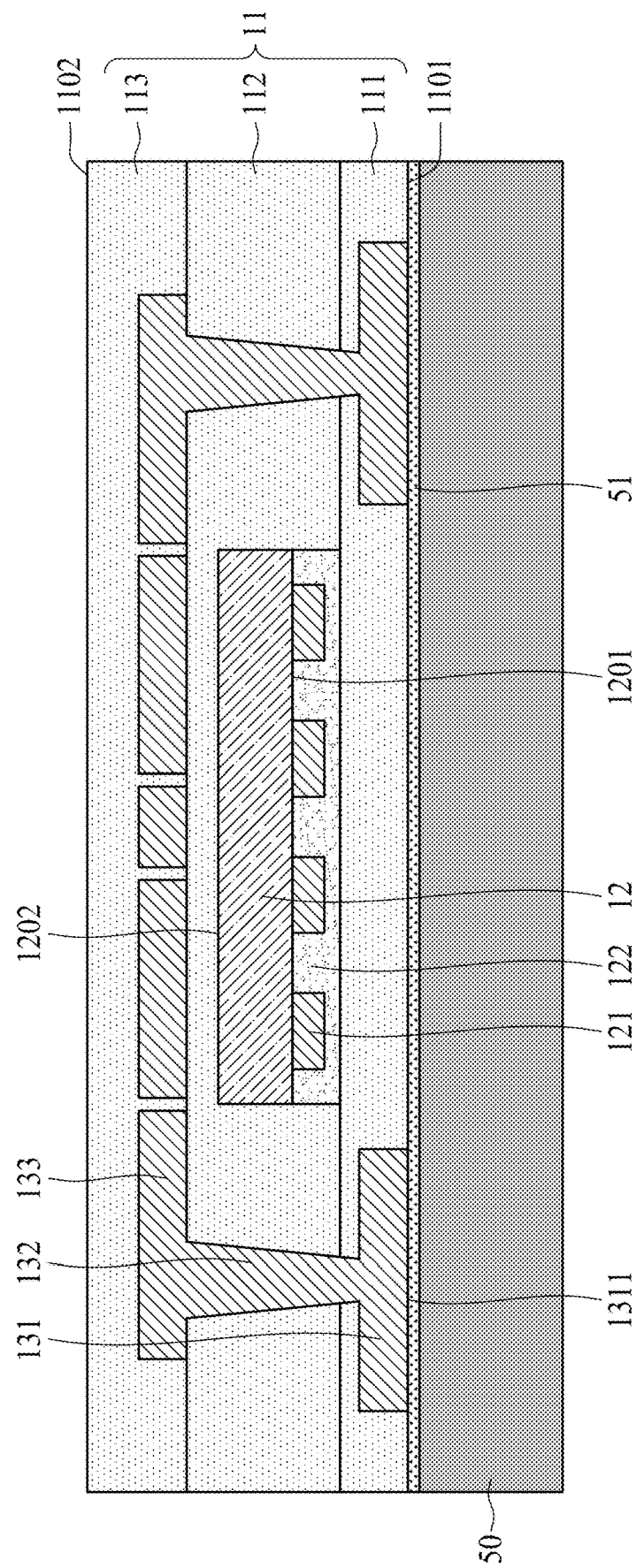

Referring to FIG. 15 and FIG. 33, a dielectric layer 113 may be formed on the dielectric layer 112. The conductive layer 133 may be covered by the dielectric layer 113. The dielectric layers 111, 112, 113 may collaboratively form a dielectric layer 11. The dielectric layer 11 may have a first surface 1101 and a second surface opposite the first surface 1101.

Figure 16:
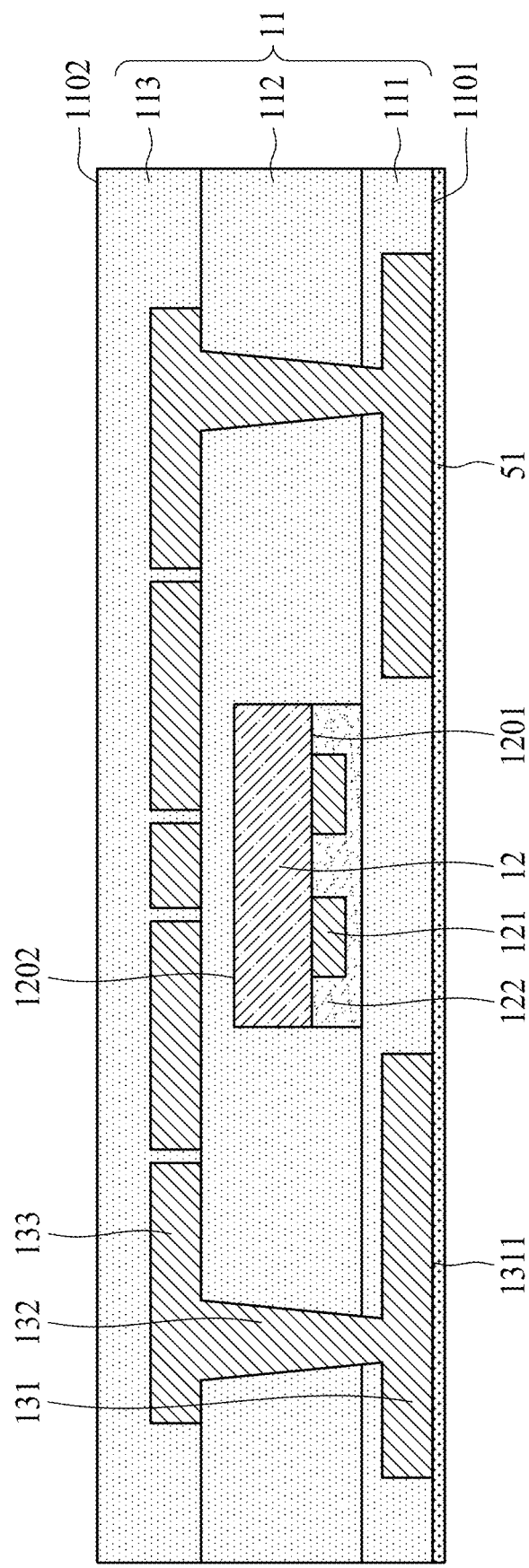
Figure 34:
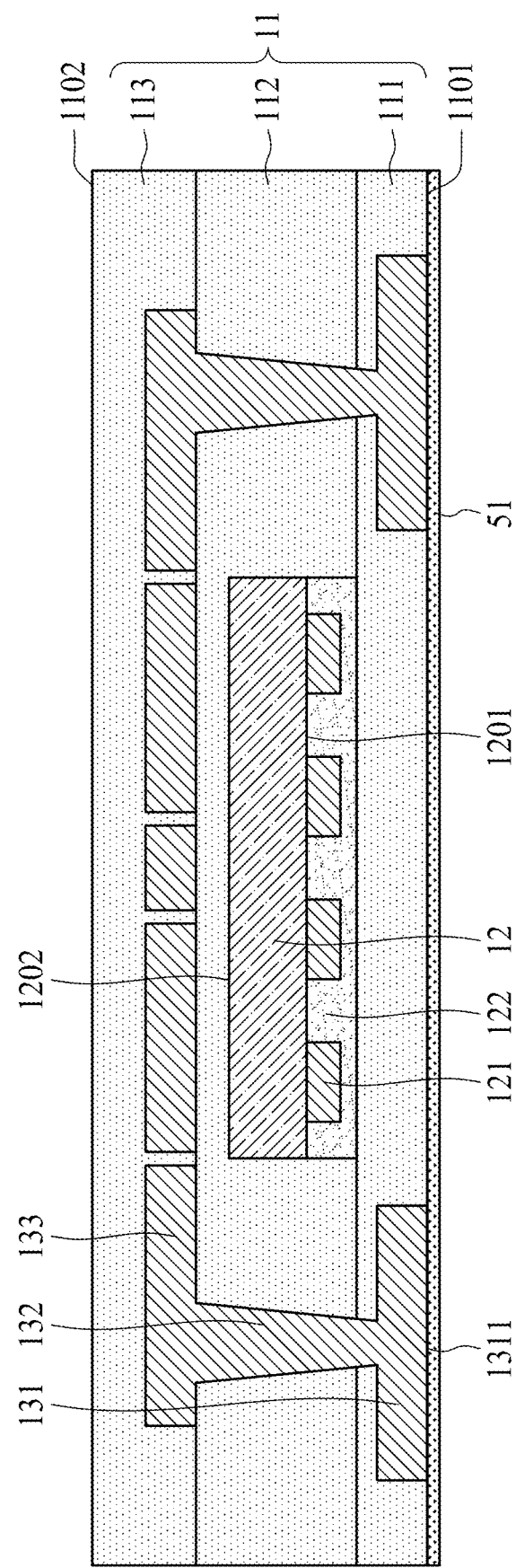

Referring to FIG. 16 and FIG. 34, the carrier 50 may be removed. The seed layer 51 may be exposed.

Figure 17:
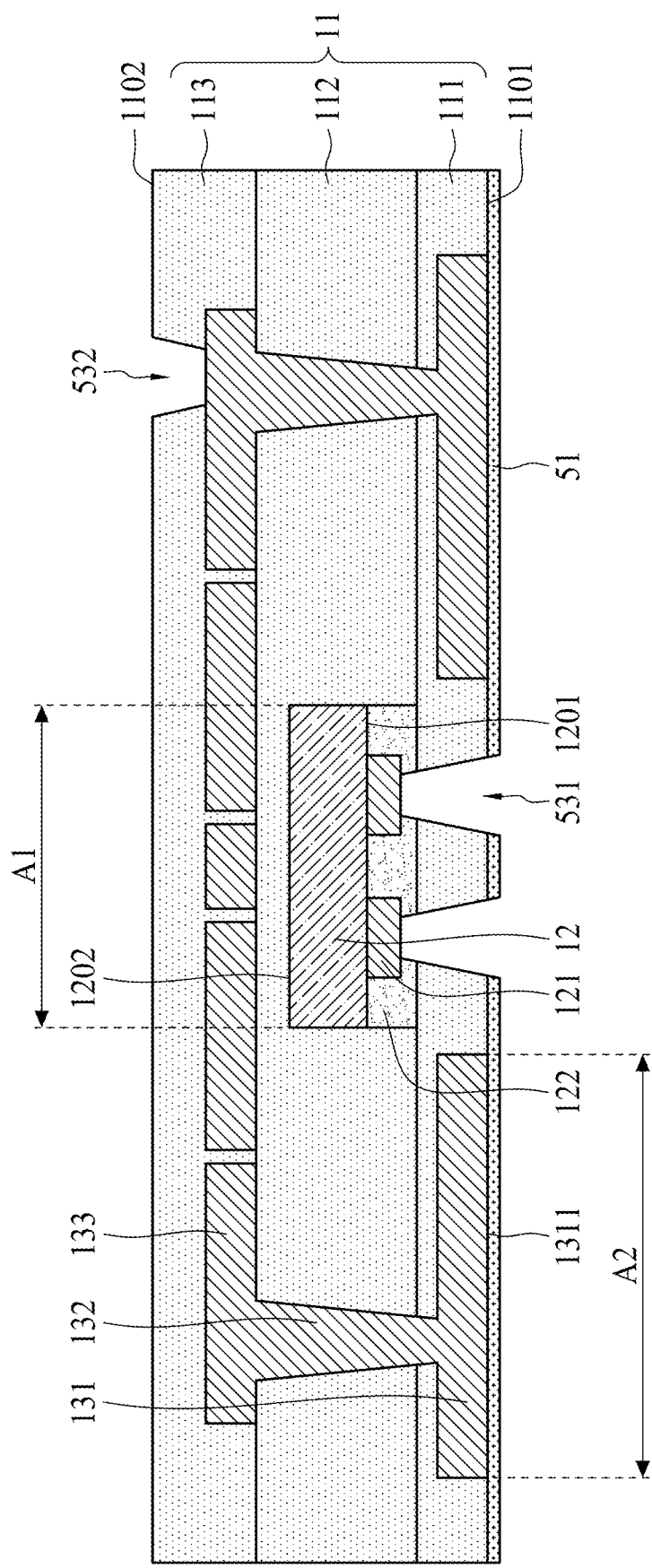
Figure 35:
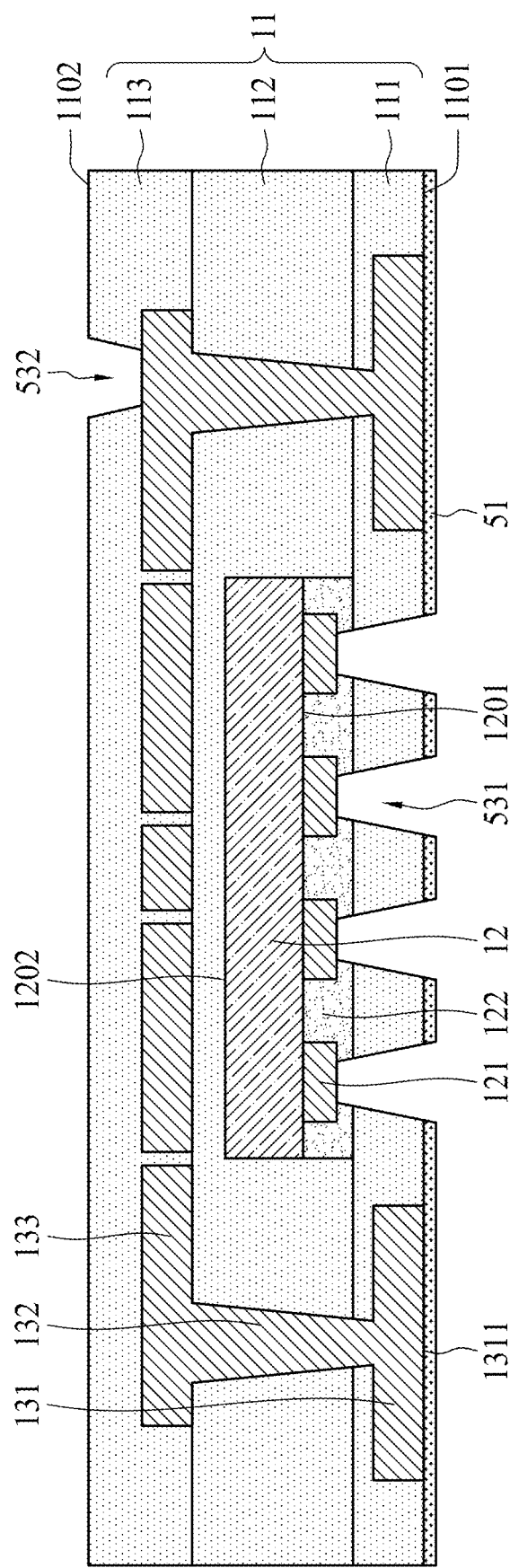

Referring to FIG. 17 and FIG. 35, a plurality of holes 531 may be formed on the conductive pads 121 by, for example, a laser drilling process. The plurality of holes 531 may extend from the seed layer 51 to the conductive pads 121. A hole 532 may be formed on the conductive layer 133 by, for example, a laser drilling process. The hole 532 may extend from the surface 1102 to the conductive layer 133. As shown in FIG. 17, the electronic component 12 may have a projection area A1 on the surface 1101 of the dielectric layer 11 and the conductive layer 131 may have a projection area A2 on the surface 1101 of the dielectric layer 11. There may be an absence of overlap between the projection A1 of the electronic component 12 and the projection A2 of the conductive layer 13. Thus, during the process of laser drilling the holes 531, the conductive layer 131 can remain intact.

Figure 18:
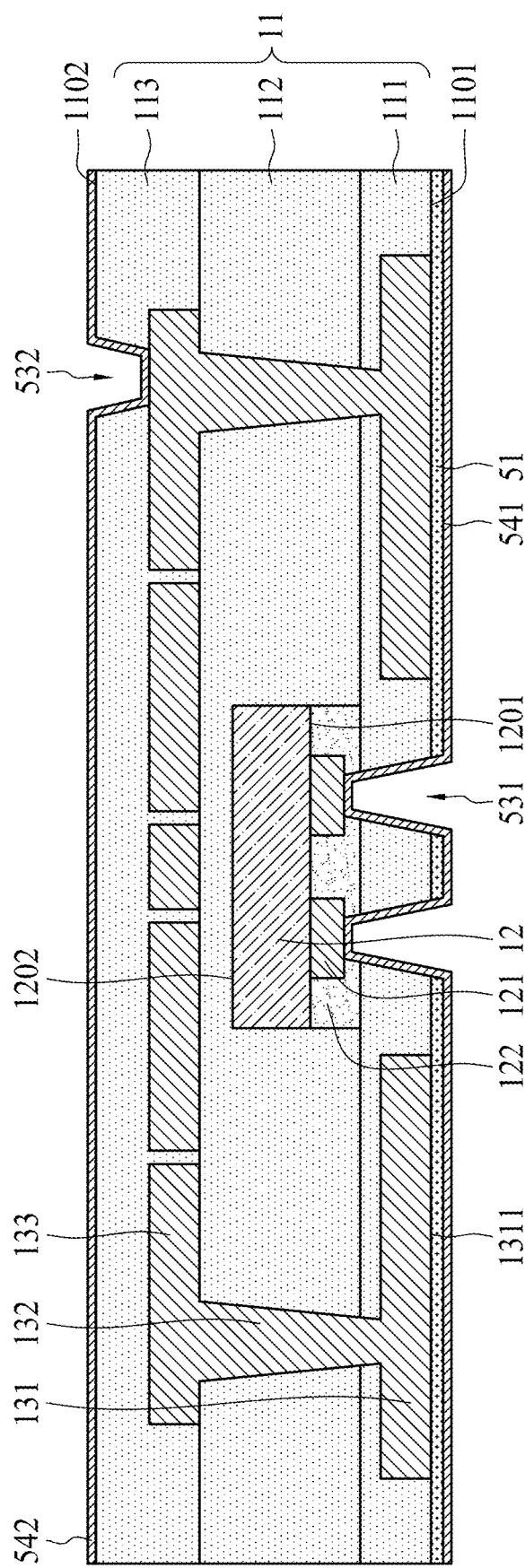
Figure 36:
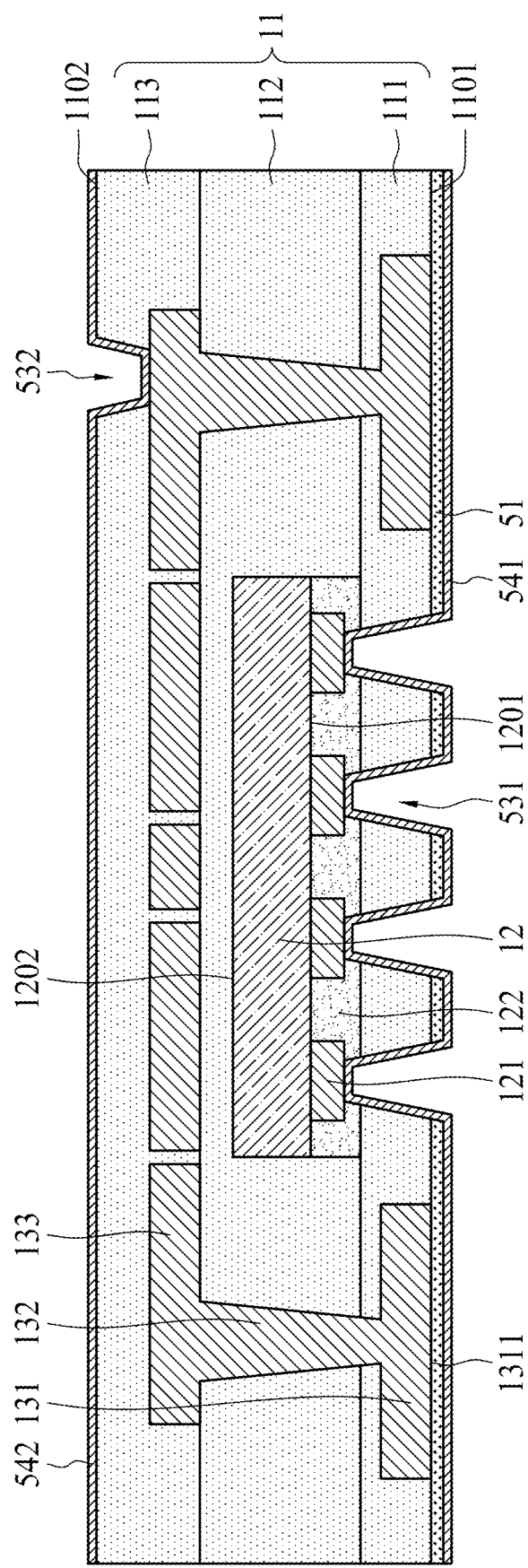

Referring to FIG. 18 and FIG. 36, a seed layer 541 may be formed on the seed layer 51 and along the sidewalls of the holes 531 by, for example, a sputter process. In other words, the seed layer 51 may be formed on the carrier prior to forming the conductive layer 131, and the seed layer 541 may be formed on the seed layer 51 after the carrier 50 is removed. The seed layer 51 and the seed layer 541 may be referred to as a multiple seed layer. The seed layer 541 may be referred to as a single seed layer. A seed layer 542 may be formed on the surface 1102 and along the sidewall of the hole 532 by, for example, a sputter process. The seed layer 542 may be referred to as a single seed layer.

Figure 19:
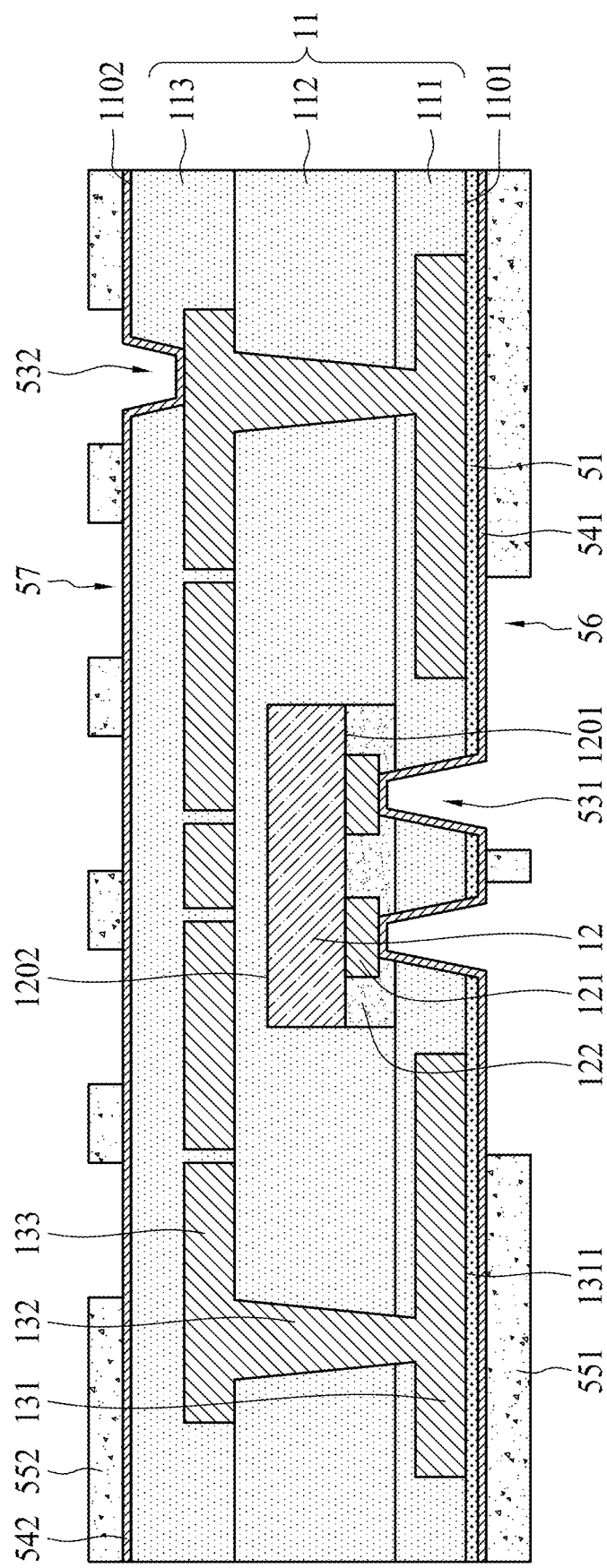
Figure 37:
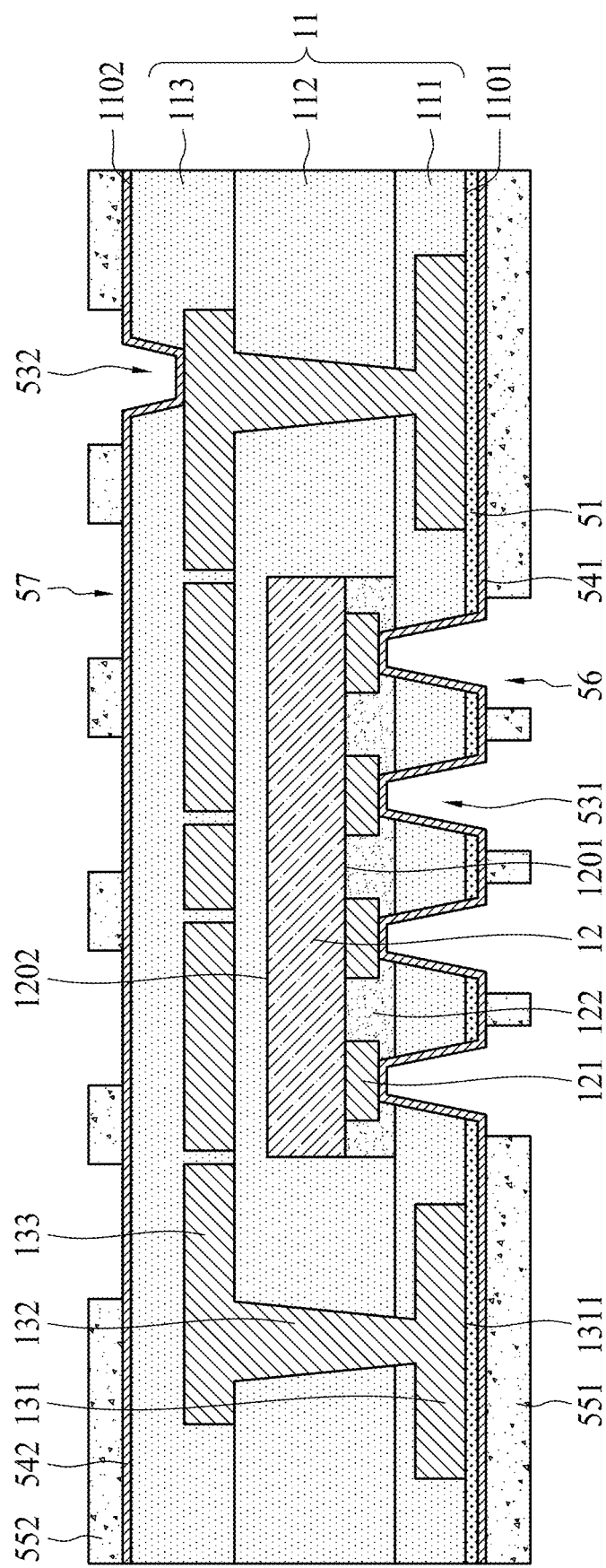

Referring to FIG. 19 and FIG. 37, a photo resist 551 may be formed and patterned on the seed layer 541. The photo resist 551 may define a region 56 exposing the seed layer 541. A photo resist 552 may be formed and patterned on the seed layer 542. The photo resist 552 may define a region 57 exposing the seed layer 542.

Figure 20:
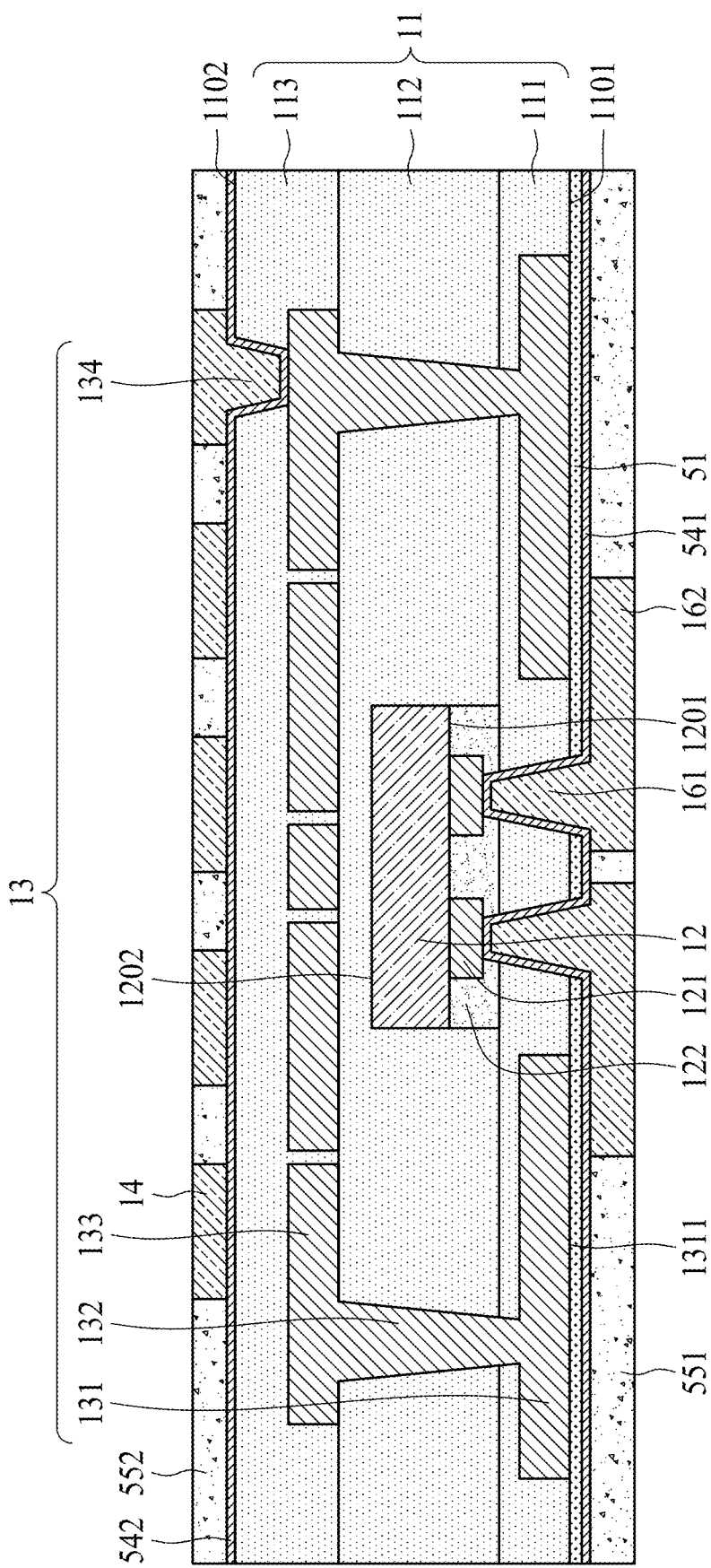
Figure 38:
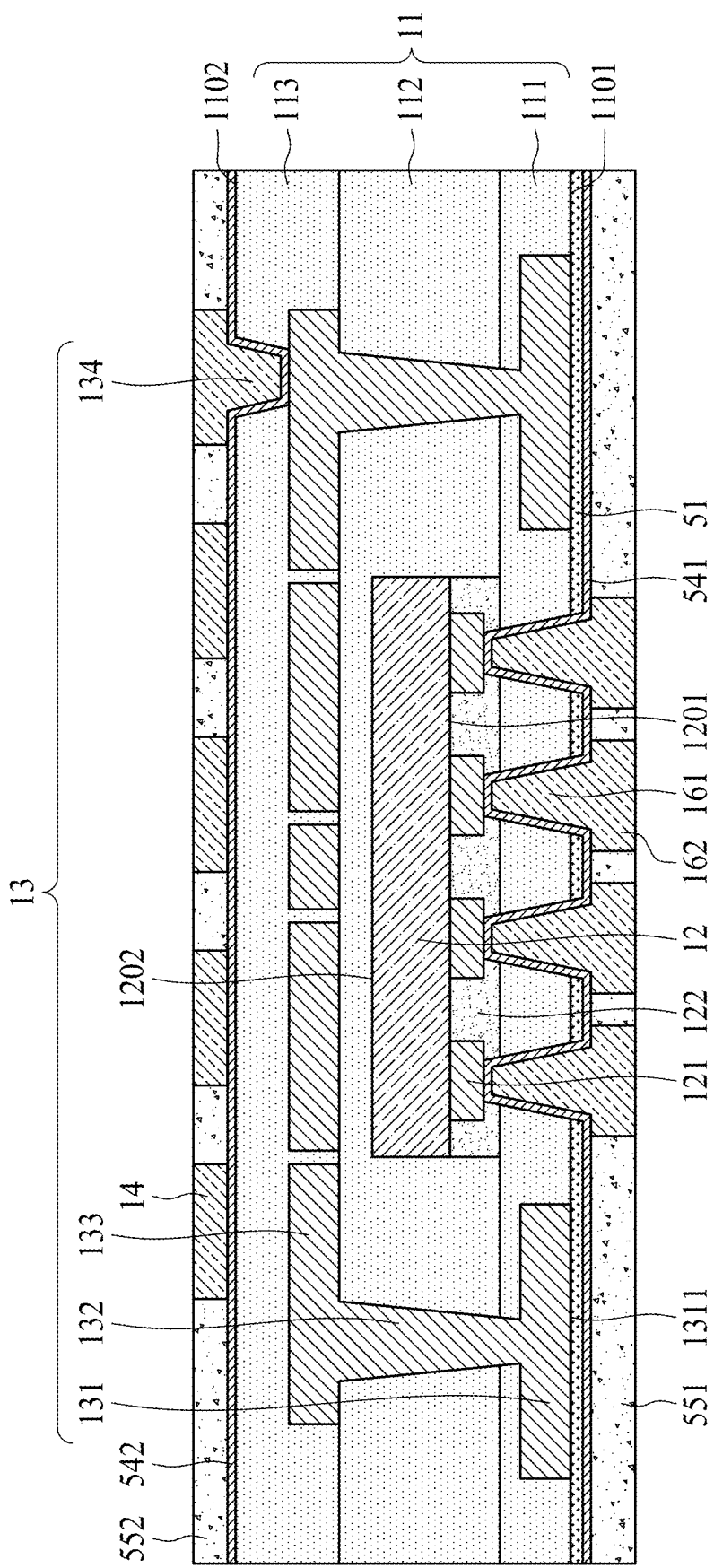

Referring to FIG. 20 and FIG. 38, a conductive via 161 may be formed in the holes 531, i.e., the conductive via 161 may extend through the dielectric layer 111. Furthermore, a conductive layer 162 may be formed in the region 56. A conductive via 134 may be formed in the hole 532 and an antenna 14 may be formed in the region 57.

Figure 21:
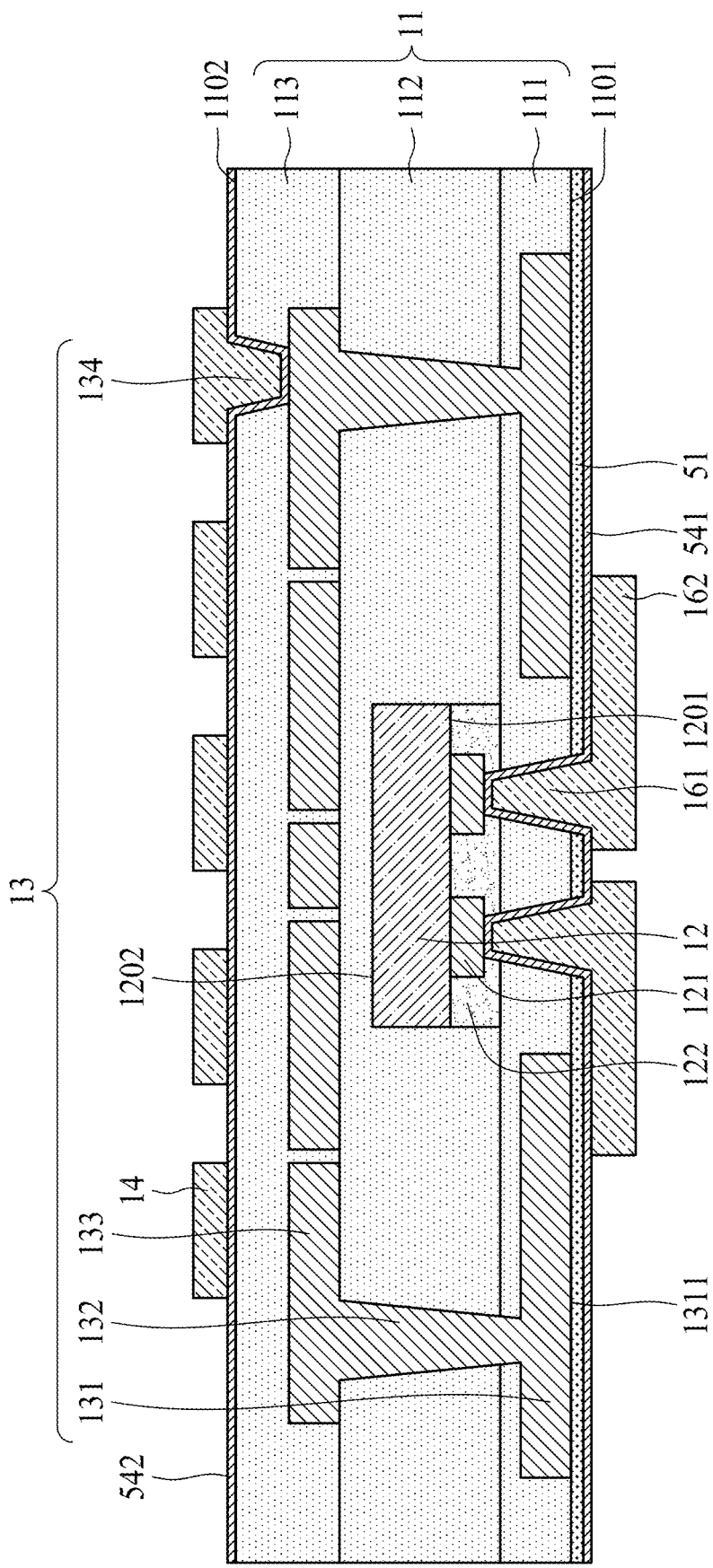
Figure 39:
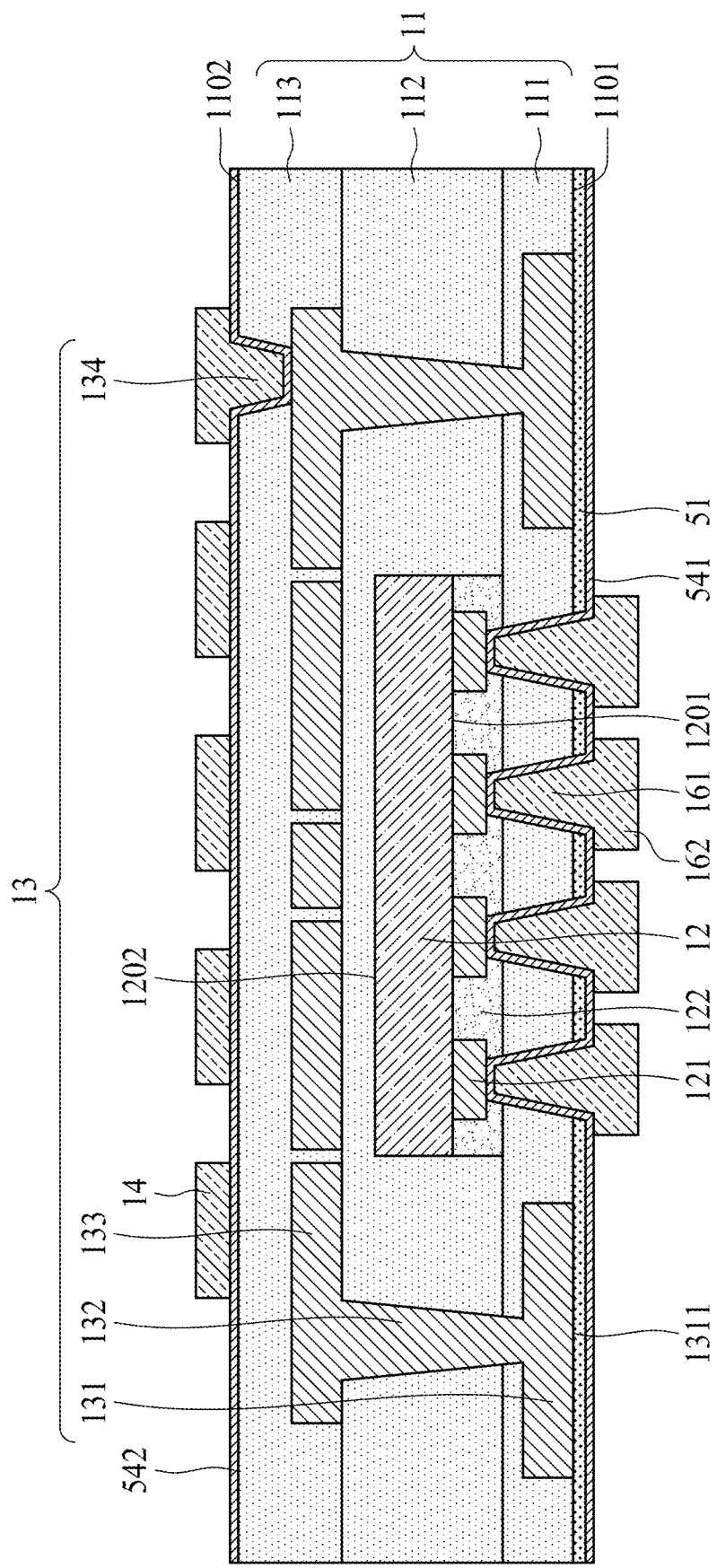

Referring to FIG. 21 and FIG. 39, the photo resist 551 and the photo resist 552 may be removed by an etch process. The seed layer 541 may have a portion be exposed from the conductive layer 162. The seed layer 542 may have a portion be exposed from the antenna 14.

Figure 22:
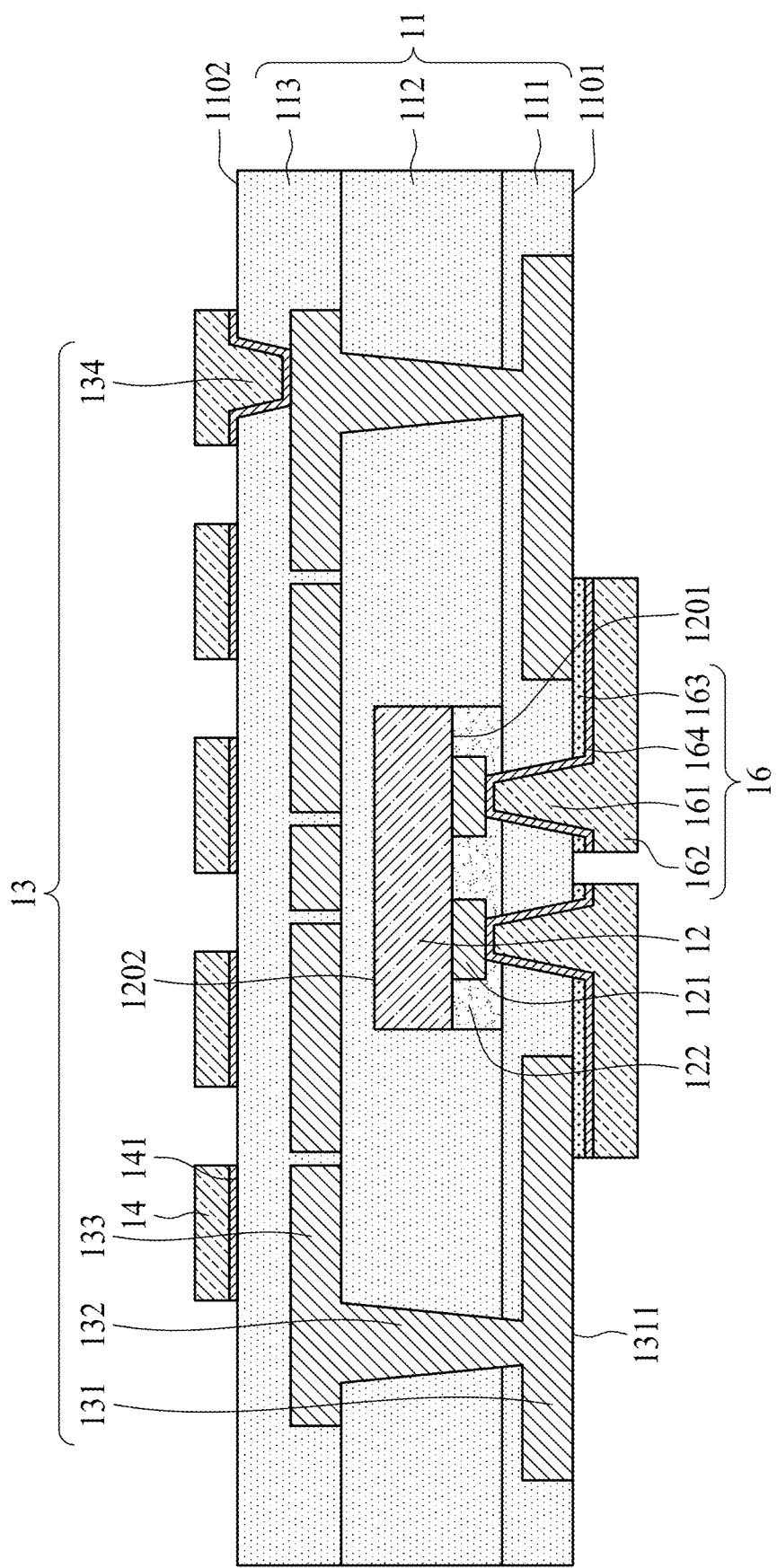
Figure 40:
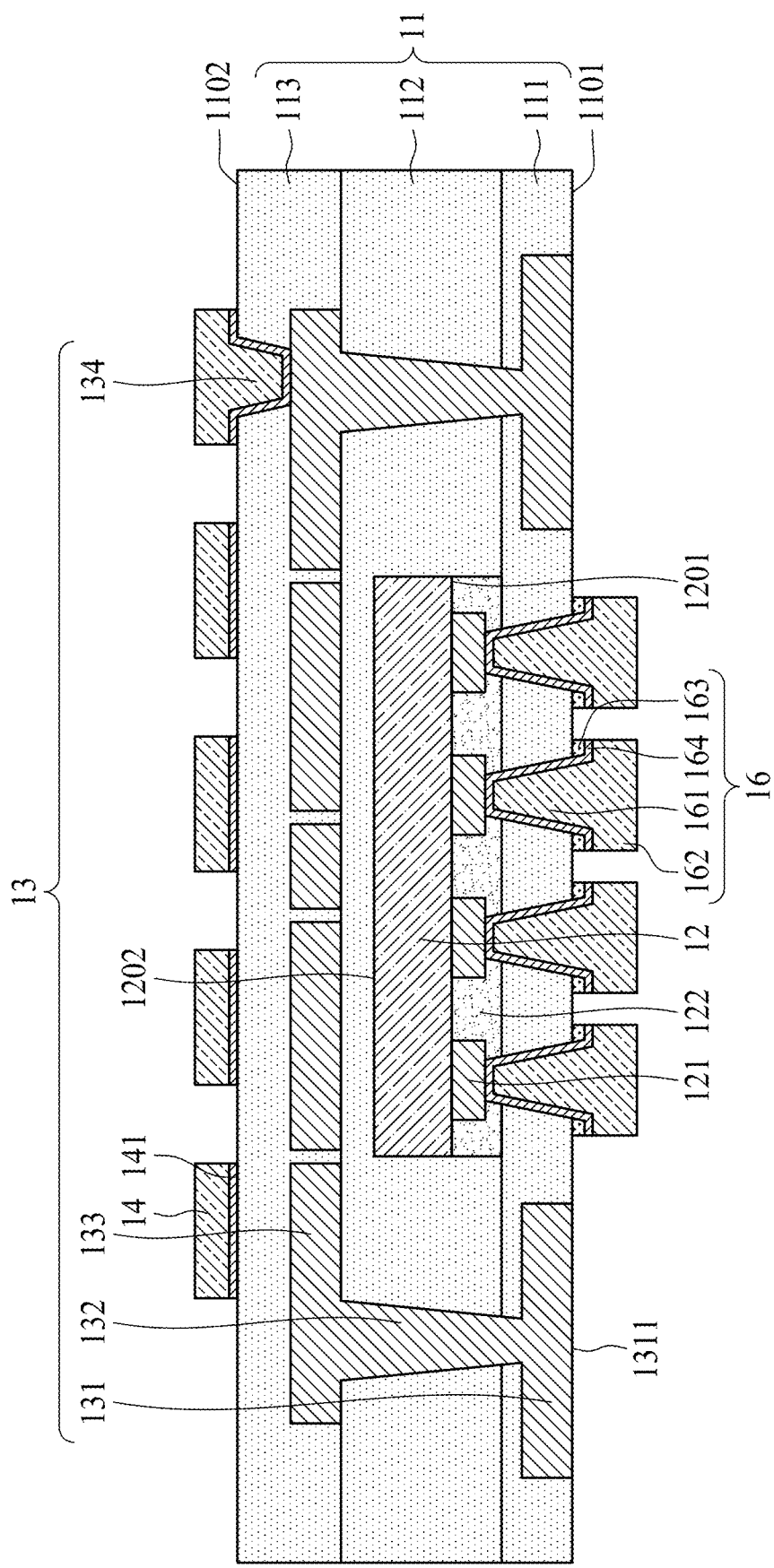

Referring to FIG. 22 and FIG. 40, the exposed portion of the seed layer 542 may be etched by, for example, a flash spray etch process. A portion of the seed layer 542 under the antenna 14 may be retained to form a seed layer 141. The seed layer 141 may be referred to as a single seed layer. Furthermore, the exposed portion of the seed layer 541 may be etched by, for example, a flash spray etch process. A portion of the seed layer 541 under the conductive layer 162 may be retained to form a seed layer 163. A portion of the seed layer 51 may then be exposed from the seed layer 541 and thus be etched by, for example, a flash spray etch process. A portion of the seed layer 51 under the conductive layer 162 may retained to form a seed layer 164. The conductive via 161, the conductive layer 162, the seed layer 163, and the seed layer 164 may be referred to as a conductive element 16. The conductive element 16 may be in contact with the exposed surface 1311 of the conductive layer 131. The electronic component 12 may be electrically connected to the conductive layer 131 through the conductive element 16. The seed layer 163 and the seed layer 164 may be referred to as a multiple seed layer. The seed layer 163 along the sidewalls of conductive via 161 may be referred to as a single seed layer. As discussed, the flash spray etch process can remove the seed layers. In some comparative embodiments, a narrow-in-line/space conductive layer having a seed layer and traversing in a length distance on the dielectric layer may be peeled off in the flash spray etch process. In the present disclosure, the conductive layer 131 is embedded in the dielectric layer 11, and only the conductive element stands on the dielectric layer. In the flash spray etch process, the probability of peel-off can be suppressed.

Figure 23:
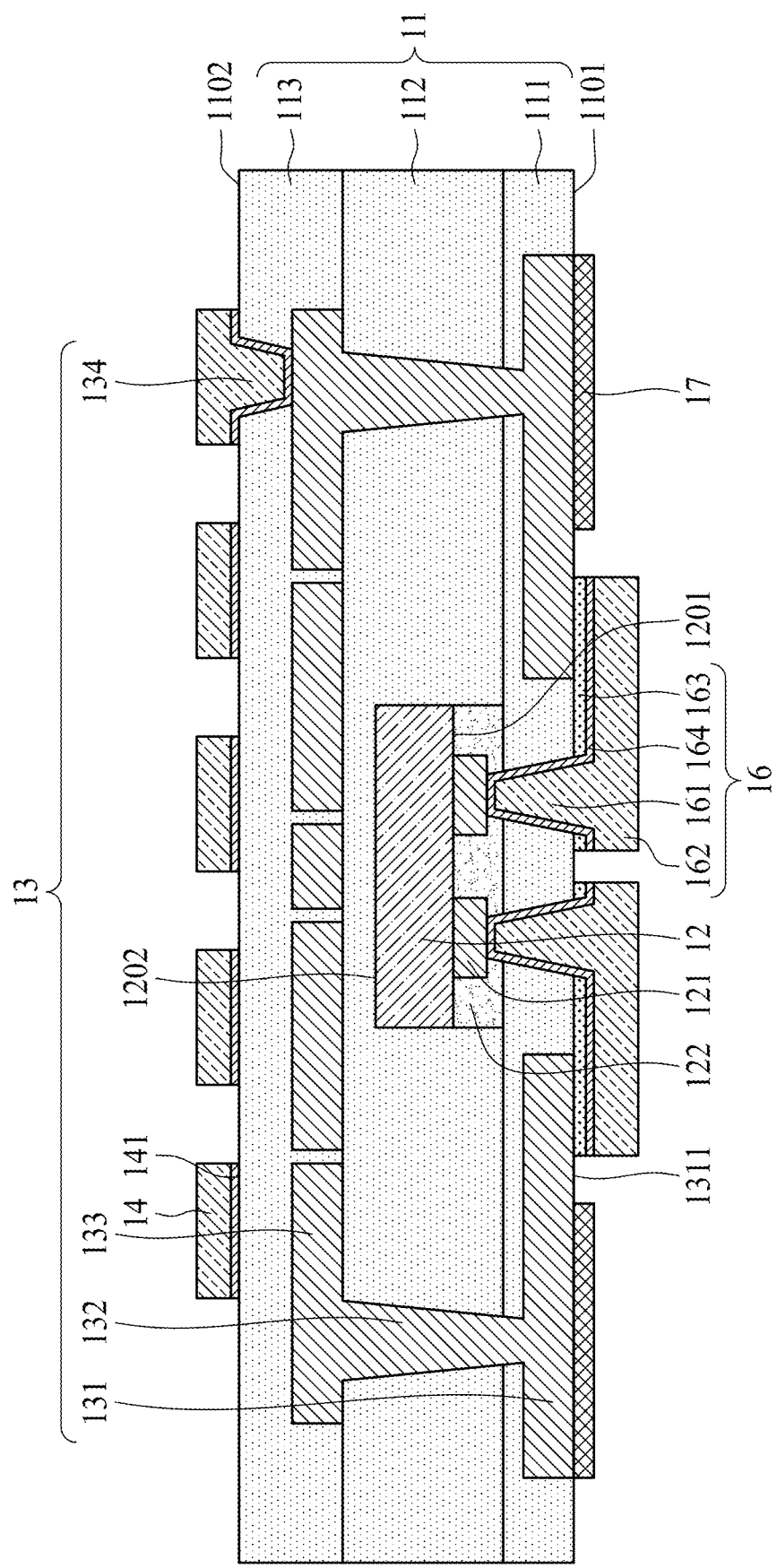
Figure 41:
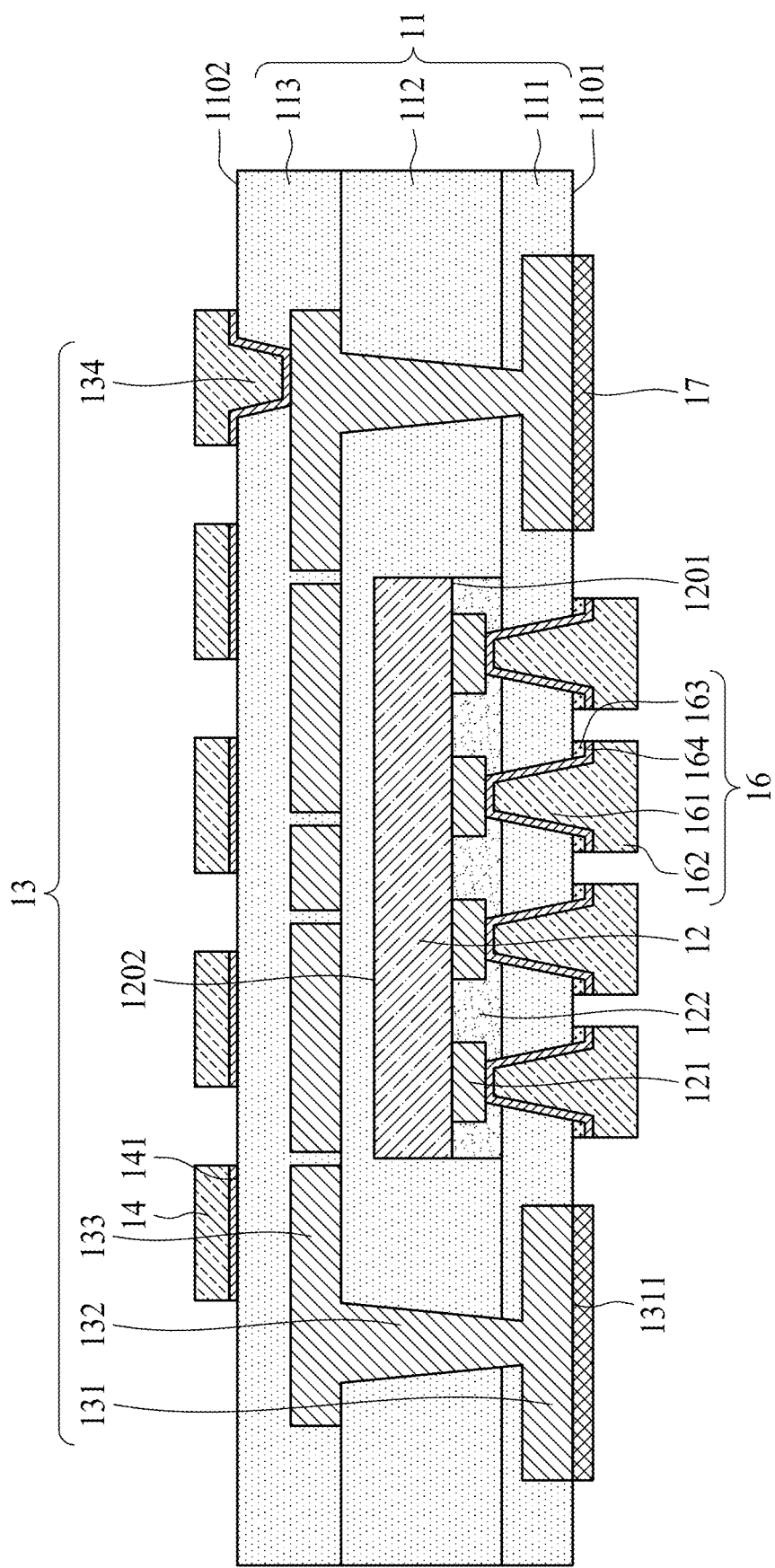

Referring to FIG. 23 and FIG. 41, a conductive pad 17 may be formed on the surface 1311 of the conductive layer 131.

Figure 24:
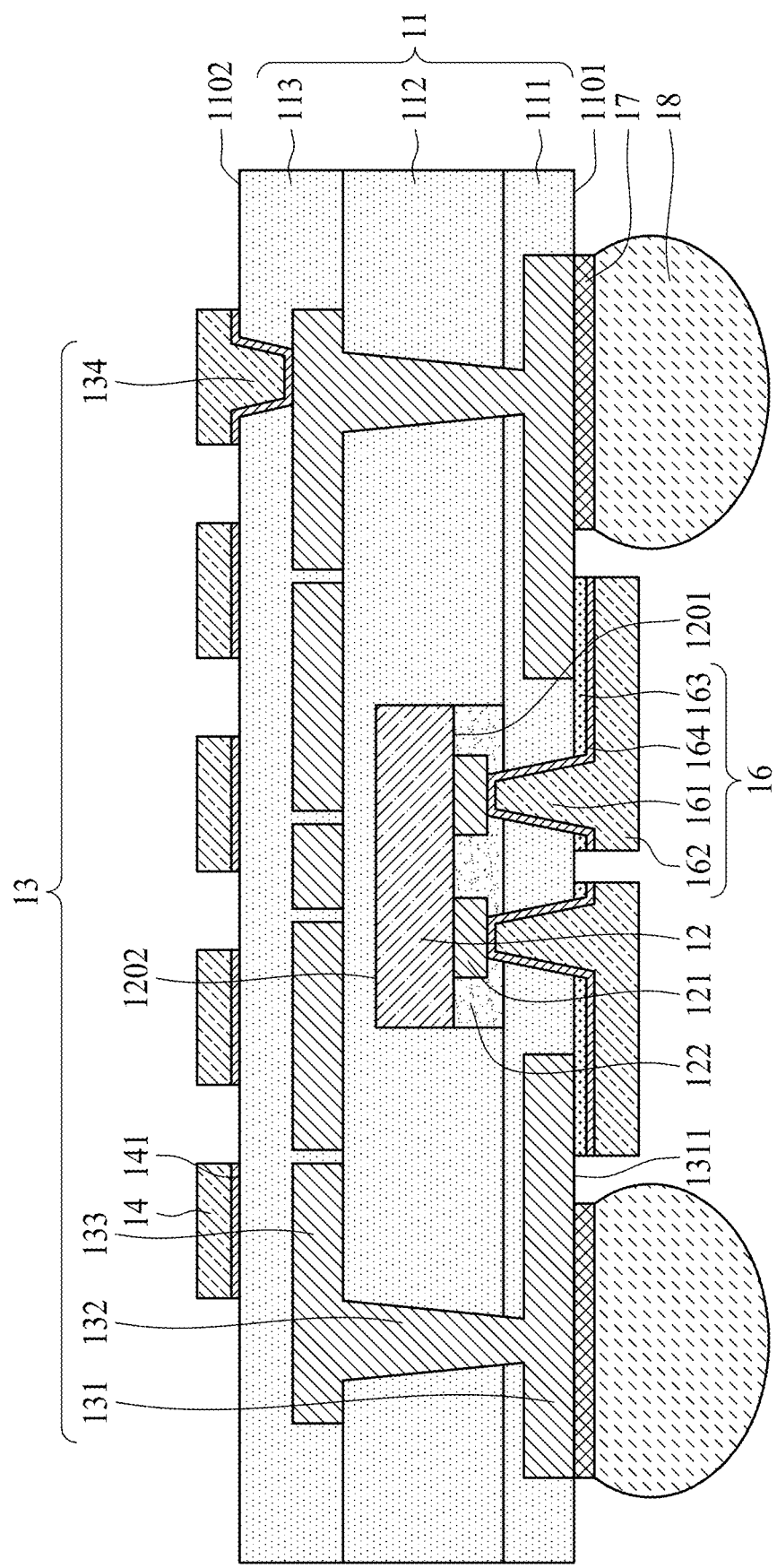
Figure 42:
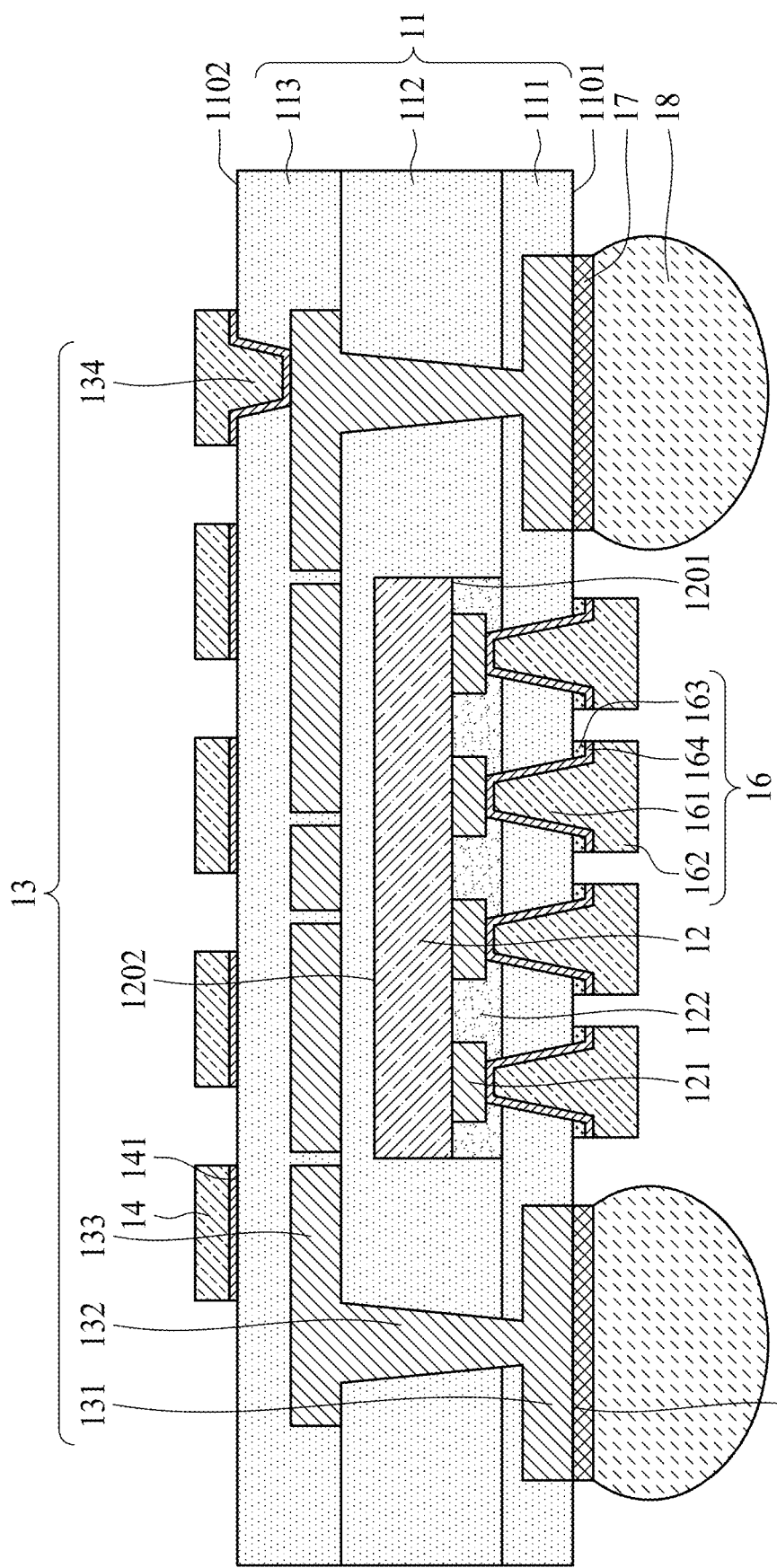

Referring to FIG. 24 and FIG. 42, a connection element 18 may be formed on the conductive pad 17.

Afterwards, an insulation layer may be formed on the surface 1101 and an insulation layer may be formed on the surface 1102 to form the semiconductor device package 1 as illustrated in FIG. 1, FIG. 2, and FIG. 3.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
    a first dielectric layer having a first surface and a second surface opposite to the first surface,
    an electronic component embedded in the first dielectric layer and having a first lateral surface and a second lateral surface adjacent to the first lateral surface;
    a plurality of first conductive layers embedded in the first dielectric layer and adjacent to the first surface of the first dielectric layer;
    a plurality of conductive elements disposed on the first surface of the first dielectric layer and in contact with the first conductive layers,
    wherein from a bottom view, a number of the conductive elements projected on the first lateral surface is less than a number of the conductive elements projected on the second lateral surface.

2. An antenna device, comprising:
    a dielectric layer having a first surface and a second surface opposite to the first surface,
    an antenna disposed on the second surface of the dielectric layer;
    a first conductive layer disposed in the dielectric layer;
    a conductive element disposed on the first surface of the dielectric layer and electrically connected to the antenna through the first conductive layer,
    wherein the first conductive layer has a first portion exposed from the conductive element and a second portion in contact with the conductive element, and
    wherein the first conductive layer traverses in the dielectric layer in a direction parallel to the first surface of the dielectric layer; and
    a solder ball, wherein a projecting area of the solder ball on the first surface of the dielectric layer is non-overlapping with a projecting area of the conductive element on the first surface of the dielectric layer, and wherein the solder ball is electrically connected to the conductive element through the first conductive layer.

3. The semiconductor device package of claim 1, wherein a width of the conductive elements is smaller than a width of the first conductive layers from the bottom view.

4. The semiconductor device package of claim 3, wherein the first conductive layers have a lower surface partially exposed by the conductive elements.

5. The semiconductor device package of claim 4, wherein the first conductive layers have a first portion overlapping the conductive elements in a direction perpendicular to the first surface of the first dielectric layer and a second portion exposed by the conductive elements, and wherein an area of the first portion is smaller than that of the second portion.

6. The semiconductor device package of claim 1, wherein the first dielectric layer has a first portion embedding the first conductive layers and the electronic component includes a second dielectric layer disposed over an active surface of the electronic component and connected to the first portion of the first dielectric layer, and wherein the conductive elements has a plurality of conductive vias tapering toward the electronic component and extending through the first portion of the first dielectric layer, and the plurality of conductive vias are partially disposed in the second dielectric layer.

7. The semiconductor device package of claim 6, wherein the conductive elements have a first seed layer disposed over a surface of the plurality of conductive vias and connecting a plurality of conductive pads of the electronic component with the plurality of conductive vias, and wherein a portion of the first seed layer is disposed under the first portion of the first dielectric layer.

8. The semiconductor device package of claim 7, wherein the conductive elements have a second seed layer disposed between the first portion of the first dielectric layer and the first seed layer, and wherein the second seed layer is in contact with a lower surface of the first portion of the first dielectric layer and a lower surface of each of the first conductive layers.

9. The semiconductor device package of claim 1, further comprising a shielding layer covering the electronic component and having a discontinuous pattern with at least three gaps, wherein two of the at least three gaps overlap the electronic component in a cross-sectional view.

10. The semiconductor device package of claim 9, further comprising a first conductive via connecting the shielding layer and having a shape tapering toward the first conductive layers, wherein each of the conductive elements has a second conductive via having a shape tapering in an opposite direction of the shape of the first conductive via.

11. The semiconductor device package of claim 9, further comprising a plurality of antenna units disposed over the shielding layer and electrically connected to the conductive elements through the first conductive layers, wherein a portion of the antenna units overlaps the at least three gaps in the cross-sectional view.

12. The semiconductor device package of claim 1, further comprising a plurality of connection elements connected to the first conductive layers, wherein the conductive elements includes at least four conductive elements disposed directly below the electronic component and spaced apart from each other, wherein the at least four conductive elements do not extend over a lateral surface of the electronic component in a cross-sectional view, and wherein the connection elements surrounds the at least four conductive elements.

13. The semiconductor device package of claim 12, wherein the at least four conductive elements are non-overlapping with the first conductive layers in the cross-sectional view.

14. The antenna device of claim 2, wherein the first conductive layer has a long side extending parallel to the first surface of the dielectric layer.

15. The antenna device of claim 14, wherein the first conductive layer has a short side connected to the long side and extending perpendicular to the first surface of the dielectric layer, wherein the short side is shorter than the long side.

16. An antenna device, comprising:
  a dielectric layer having a first surface and a second surface opposite to the first surface,
  an antenna disposed on the second surface of the dielectric layer;
  a first conductive layer disposed in the dielectric layer;
  a conductive element disposed on the first surface of the dielectric layer and electrically connected to the antenna through the first conductive layer,
  wherein the first conductive layer has a first portion exposed from the conductive element and a second portion in contact with the conductive element, and
  wherein the first conductive layer traverses in the dielectric layer in a direction parallel to the first surface of the dielectric layer; and
  an electronic component embedded in the dielectric layer, wherein an upper surface and a lower surface of the first conductive layer are at elevations higher than the conductive element and lower than the electronic component from a cross-sectional view.

\* \* \* \* \*